United States Patent
Kim

(10) Patent No.: US 10,665,603 B2
(45) Date of Patent: May 26, 2020

(54) MEMORY ARRAYS, AND METHODS OF FORMING MEMORY ARRAYS

(71) Applicant: Micron Technology, Inc., Boise, ID (US)

(72) Inventor: Changhan Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/521,441

(22) Filed: Jul. 24, 2019

(65) Prior Publication Data

US 2019/0348423 A1  Nov. 14, 2019

Related U.S. Application Data

(63) Continuation of application No. 15/933,218, filed on Mar. 22, 2018, now Pat. No. 10,438,962.

(Continued)

(51) Int. Cl.

| | |
|---|---|
| *H01L 27/11* | (2006.01) |
| *H01L 27/1157* | (2017.01) |
| *H01L 27/11565* | (2017.01) |
| *H01L 21/762* | (2006.01) |
| *H01L 27/11582* | (2017.01) |
| *H01L 27/11519* | (2017.01) |
| *H01L 27/11556* | (2017.01) |
| *H01L 27/11524* | (2017.01) |
| *H01L 29/51* | (2006.01) |
| *H01L 21/764* | (2006.01) |

(52) U.S. Cl.
CPC .... *H01L 27/1157* (2013.01); *H01L 21/76205* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 21/764* (2013.01); *H01L 29/518* (2013.01)

(58) Field of Classification Search
CPC .................................................. H01L 27/1157
See application file for complete search history.

(56) References Cited

U.S. PATENT DOCUMENTS

| | | |
|---|---|---|
| 9,653,475 B1 | 5/2017 | Yoshimizu |
| 9,728,552 B1 | 8/2017 | Fukumoto |
| (Continued) | | |

FOREIGN PATENT DOCUMENTS

| | | |
|---|---|---|
| WO | WO PCT/US2018/063590 | 3/2019 |
| WO | WO PCT/US2018/063978 | 4/2019 |
| WO | WO PCT/US2018/064401 | 4/2019 |

*Primary Examiner* — William Coleman
(74) *Attorney, Agent, or Firm* — Wells St. John P.S.

(57) ABSTRACT

Some embodiments include an assembly having a channel to conduct current. The channel includes a first channel portion and a second channel portion. A first memory cell structure is between a first gate and the first channel portion. The first memory cell structure includes a first charge-storage region and a first charge-blocking region. A second memory cell structure is between a second gate and the second channel portion. The second memory cell structure includes a second charge-storage region and a second charge-blocking region. The first and second charge-blocking regions include silicon oxynitride. A void is located between the first and second gates, and between the first and second memory cell structures. Some embodiments include memory arrays (e.g., NAND memory arrays), and some embodiments include methods of forming memory arrays.

22 Claims, 25 Drawing Sheets

Related U.S. Application Data

(60) Provisional application No. 62/610,640, filed on Dec. 27, 2017.

(56) References Cited

U.S. PATENT DOCUMENTS

| | | |
|---|---|---|
| 10,083,981 B2 | 9/2018 | Daycock |
| 10,128,265 B2 | 11/2018 | Carlson |
| 10,164,009 B1 | 12/2018 | Carlson |
| 2006/0151821 A1 | 7/2006 | Melik-Martirosian |
| 2009/0283819 A1 | 11/2009 | Ishikawa et al. |
| 2011/0233645 A1 | 9/2011 | Iinuma |
| 2012/0012920 A1 | 1/2012 | Shin et al. |
| 2015/0132915 A1 | 5/2015 | Park |
| 2015/0380431 A1 | 12/2015 | Kanamori |
| 2016/0043093 A1 | 2/2016 | Lee et al. |
| 2016/0064532 A1 | 3/2016 | Makala |
| 2016/0118398 A1 | 4/2016 | Yon et al. |
| 2016/0163725 A1 | 6/2016 | Kamiya et al. |
| 2016/0172370 A1 | 6/2016 | Makala et al. |
| 2017/0084626 A1 | 3/2017 | Kim et al. |
| 2017/0162593 A1 | 6/2017 | Shimura |
| 2017/0229474 A1 | 8/2017 | Shimizu |
| 2017/0243879 A1 | 8/2017 | Yu et al. |
| 2017/0271527 A1 | 9/2017 | Higuchi et al. |
| 2018/0277554 A1 | 9/2018 | Kaneko |

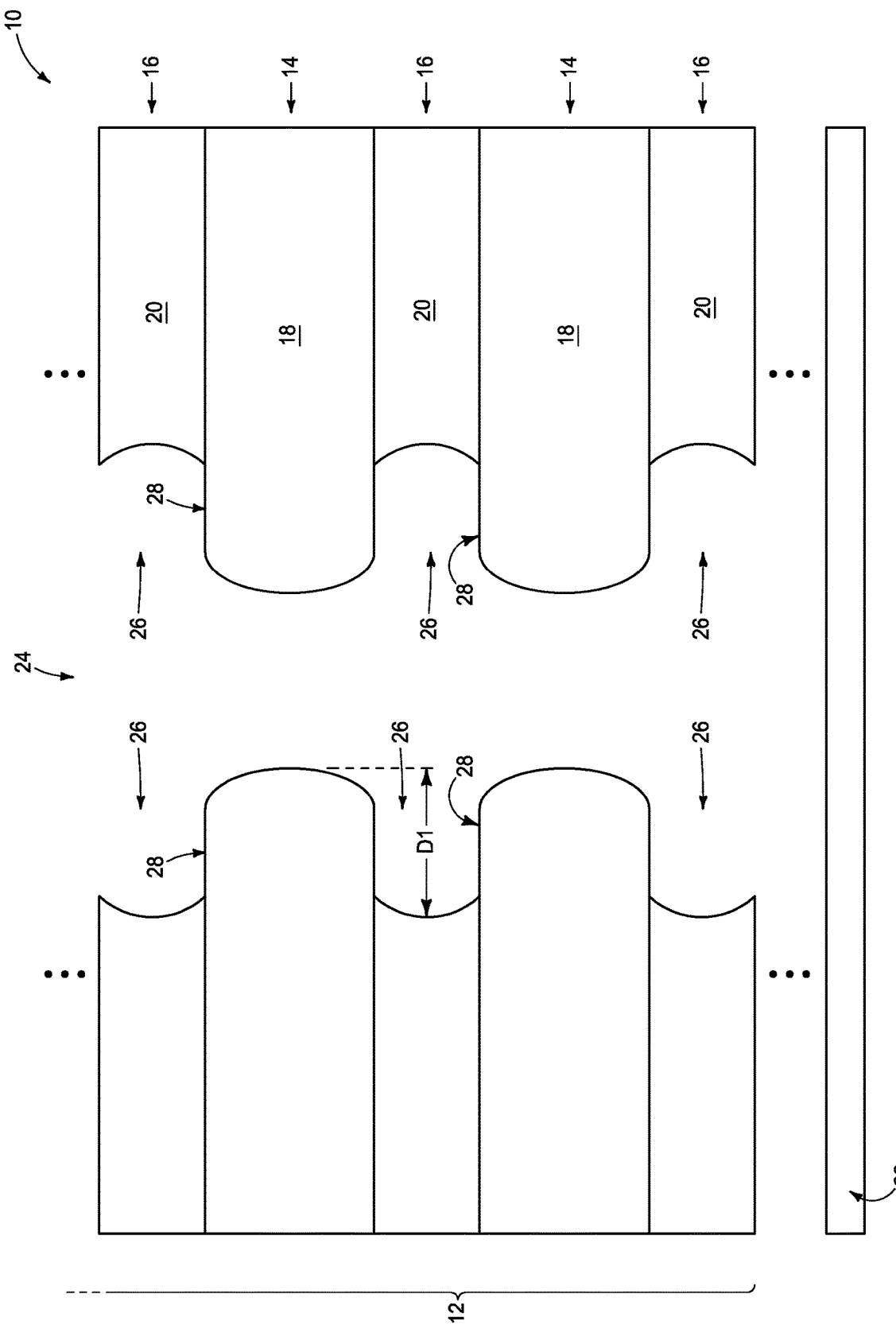

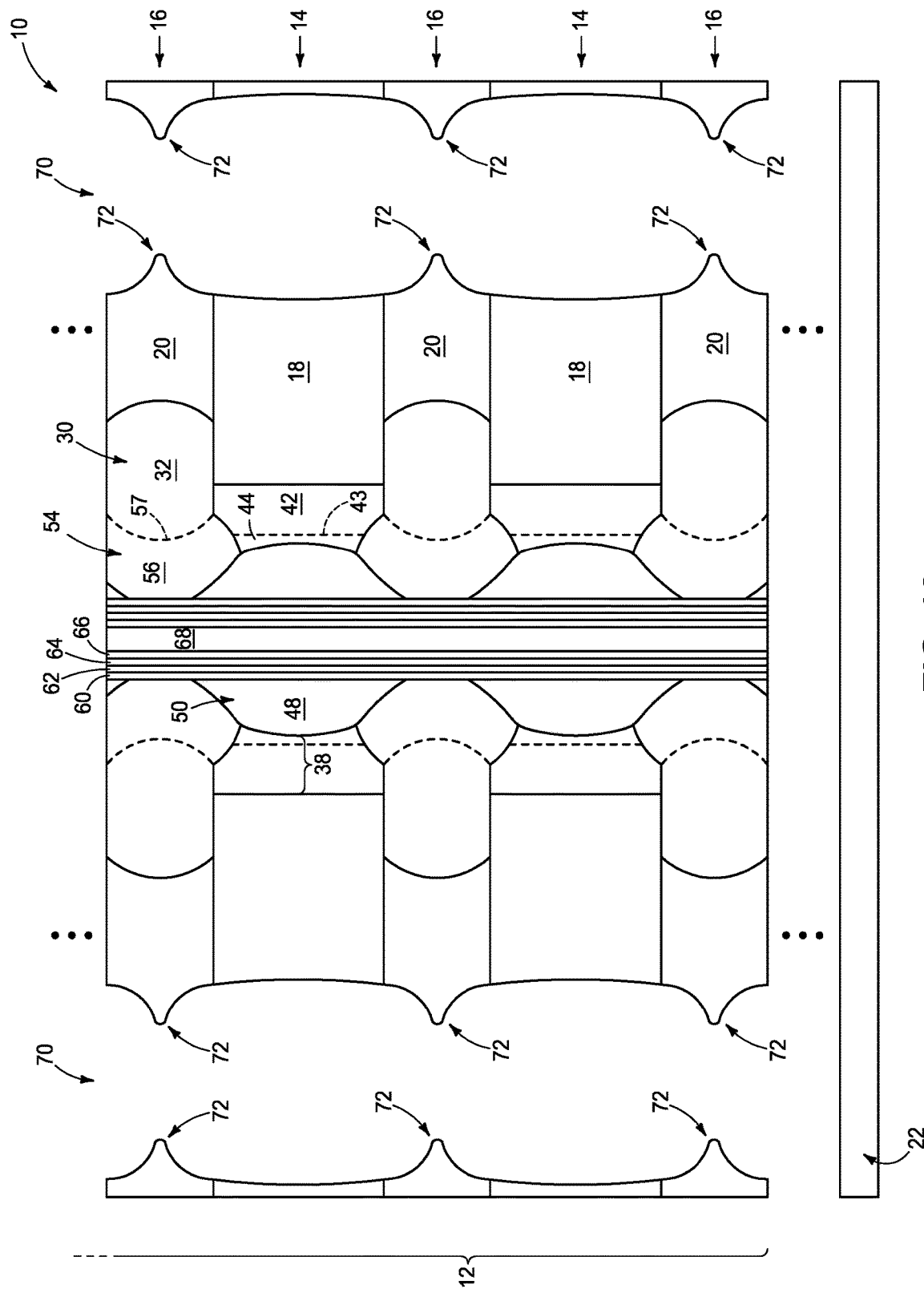

MEMORY ARRAYS, AND METHODS OF FORMING MEMORY ARRAYS

RELATED PATENT DATA

This application is a continuation of U.S. patent application Ser. No. 15/933,218, which was filed on Mar. 22, 2018, which is hereby incorporated herein by reference, and which claims priority to U.S. Provisional application Ser. No. 62/610,640, which was filed Dec. 27, 2017.

TECHNICAL FIELD

Memory arrays (e.g., NAND memory arrays), and methods of forming memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It would be desirable to develop improved memory cell designs, improved memory array architecture (e.g., improved NAND architecture), and methods for fabricating the improved memory cells and improved memory array architectures.

BRIEF DESCRIPTION OF THE DRAWINGS

FIGS. 5-23 are diagrammatic cross-sectional views of regions of a construction at example process steps of an example method for fabricating an example assembly.

DETAILED DESCRIPTION OF THE ILLUSTRATED EMBODIMENTS

Some embodiments include memory cells having charge-blocking regions which comprise silicon oxynitride. The charge-blocking regions may additionally comprise silicon dioxide. Some embodiments include memory arrays (e.g., NAND memory arrays) having vertically-stacked memory cells, and having voids between the vertically-adjacent memory cells. Some embodiments include methods of forming memory cells, and memory arrays. An example method is described with reference to FIGS. 5-23, and an example architecture is described with reference to FIG. 23.

Figure 1:
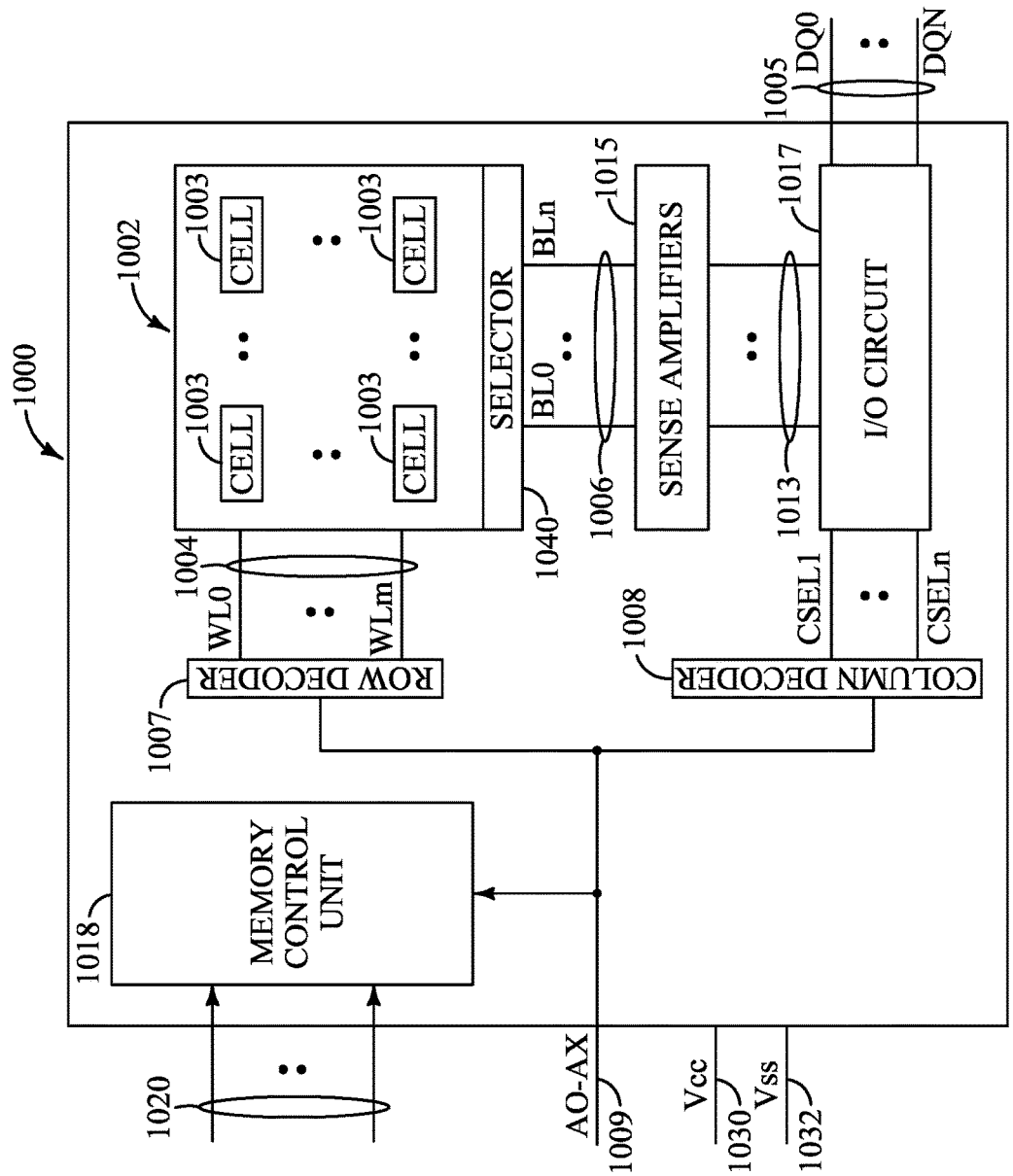
FIG. 1 shows a block diagram of a prior art memory device having a memory array with memory cells.
Figure 2:
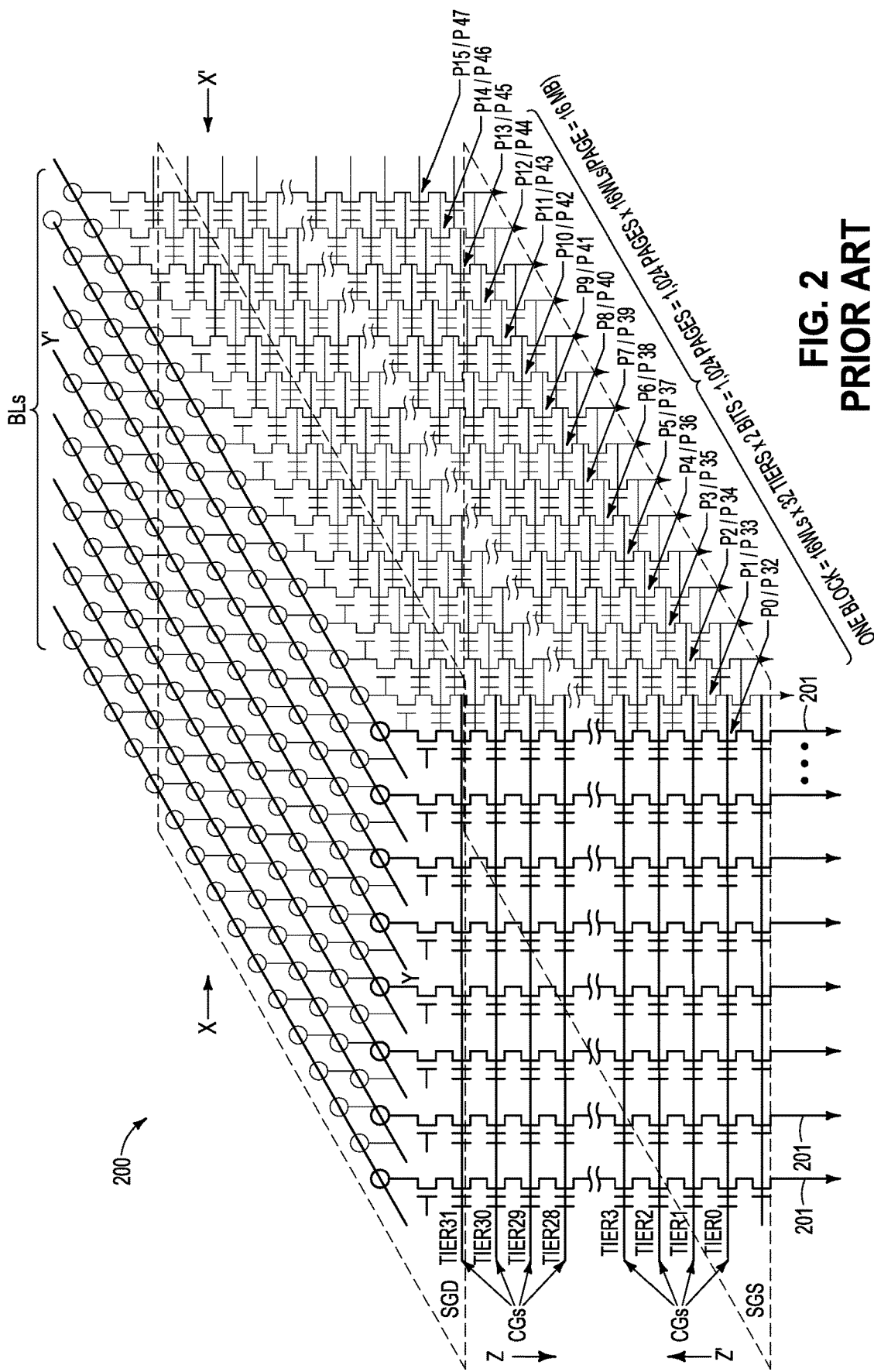
FIG. 2 shows a schematic diagram of the prior art memory array of FIG. 1 in the form of a 3D NAND memory device.
Figure 3:
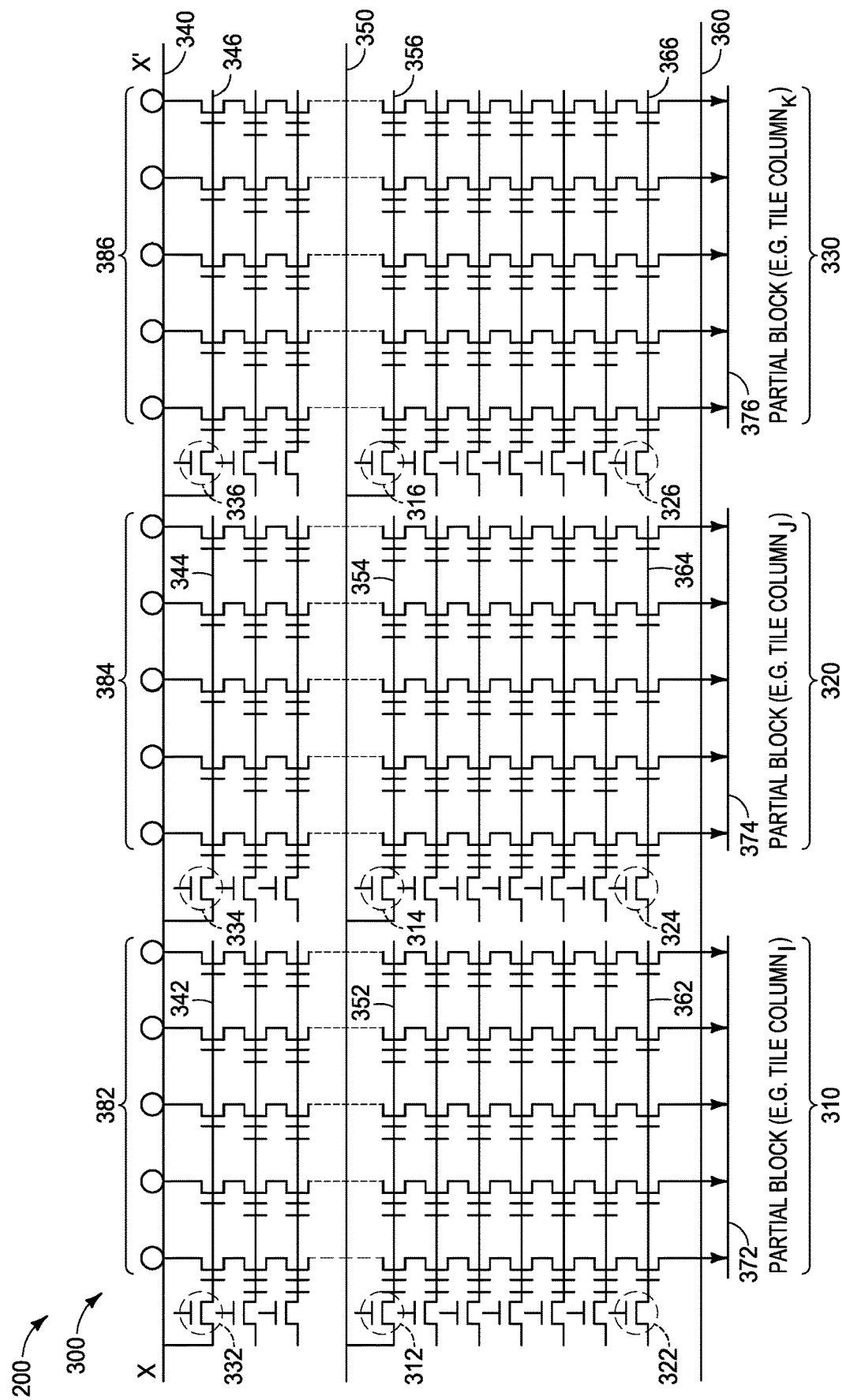
FIG. 3 shows a cross-sectional view of the prior art 3D NAND memory device of FIG. 2 in an X-X' direction.
Figure 4:
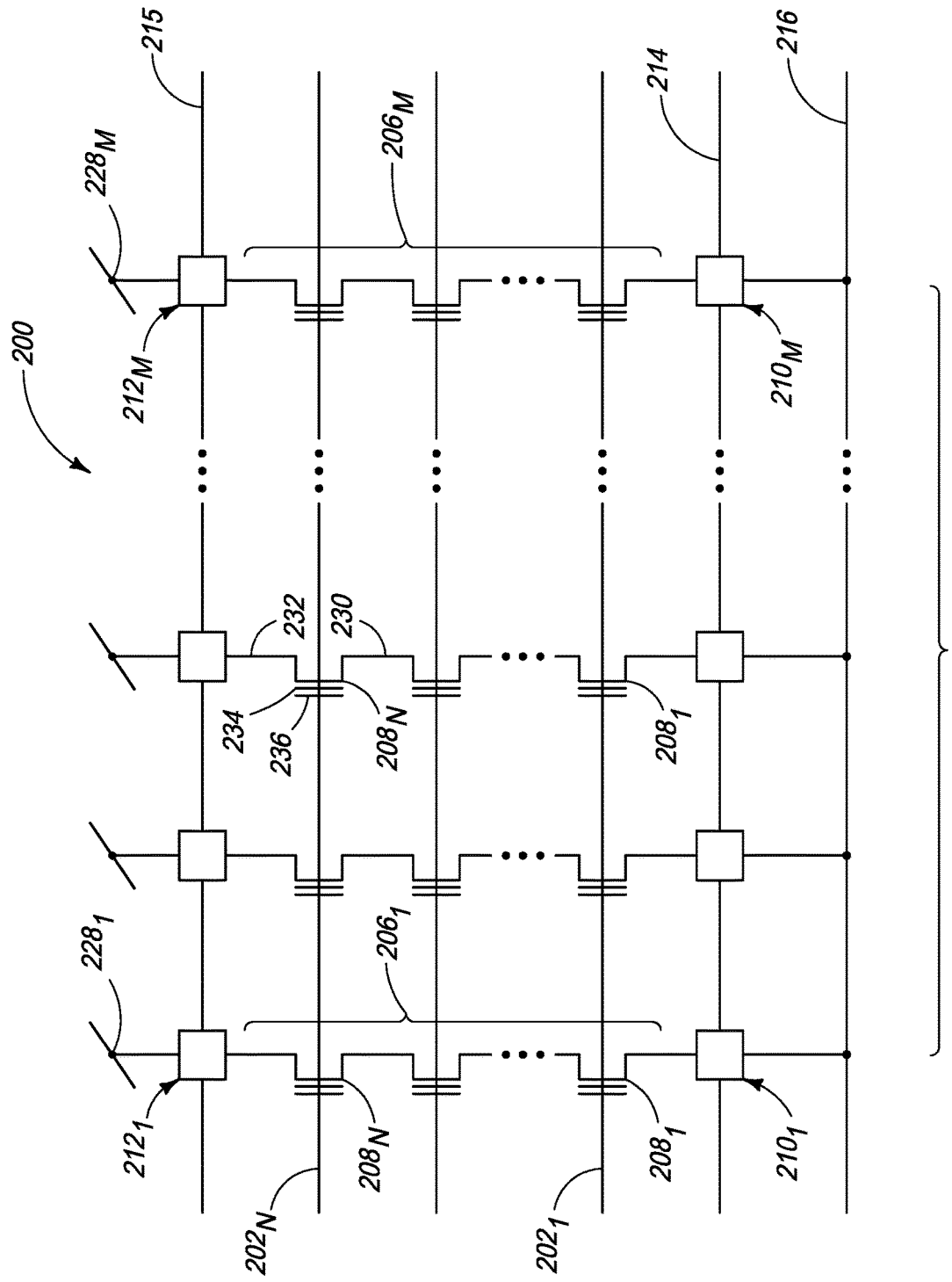
FIG. 4 is a schematic of a prior art NAND memory array.
Figure 5:
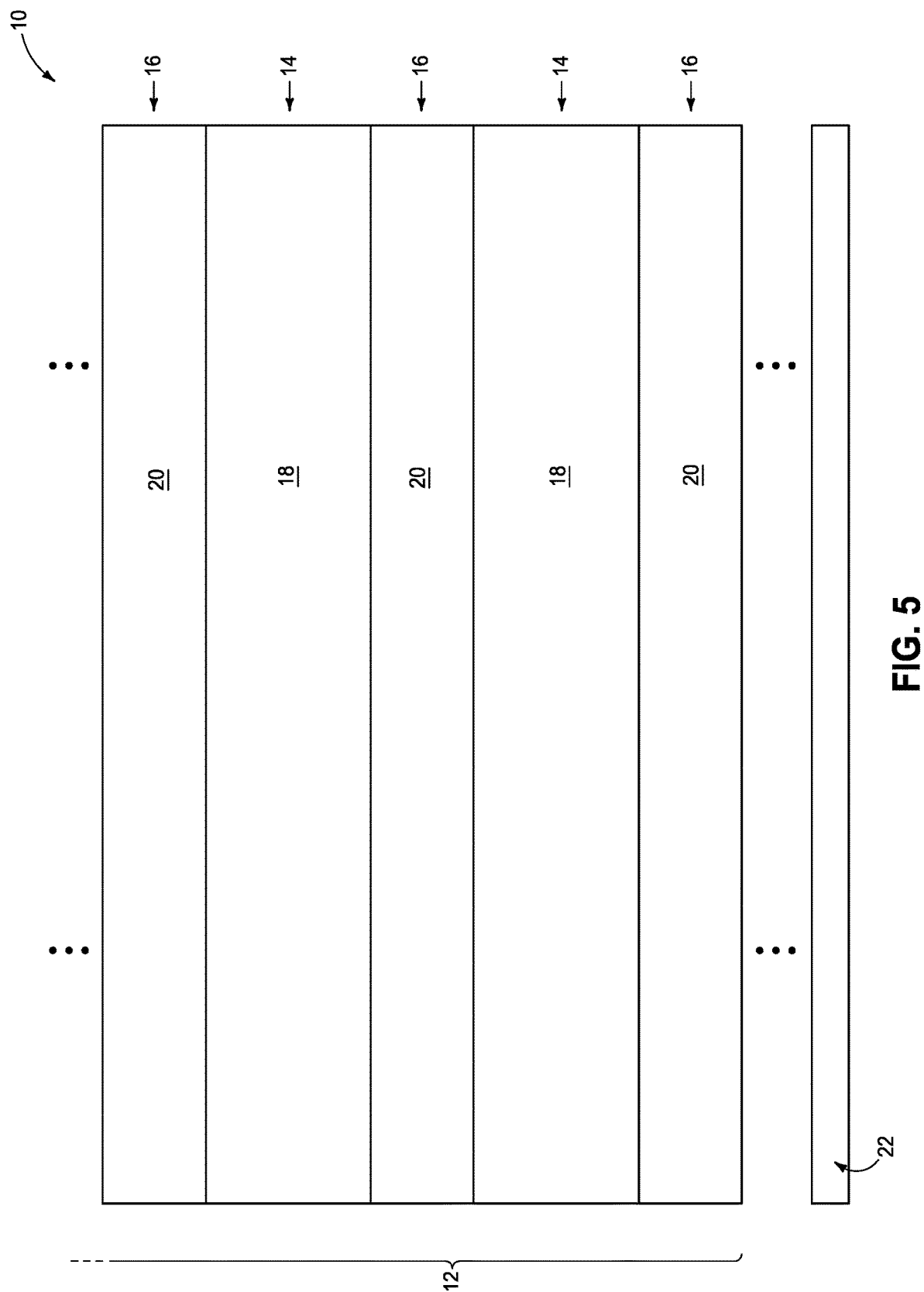

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first material 18 may be sacrificial material (e.g., silicon nitride), and the second material 20 may be insulative material (e.g., silicon dioxide).

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm. In some embodiments, the first levels 14 may be thicker than the second levels 16. For instance, in some embodiments the first levels 14 may have thicknesses within a range of from about 20 nm to about 40 nm, and the second levels 16 may have thicknesses within a range of from about 10 nm to about 30 nm.

Some of the sacrificial material 18 of the first levels 14 is ultimately replaced with conductive material of memory cell gates. Accordingly, the levels 14 may ultimately correspond to memory cell levels of a NAND configuration. The NAND configuration will include strings of memory cells (i.e., NAND strings), with the number of memory cells in the strings being determined by the number of vertically-stacked levels 14. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. A portion or portions of the cell levels may be used as select gate(s).

The vertical stack 12 is shown to extend outwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A space is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
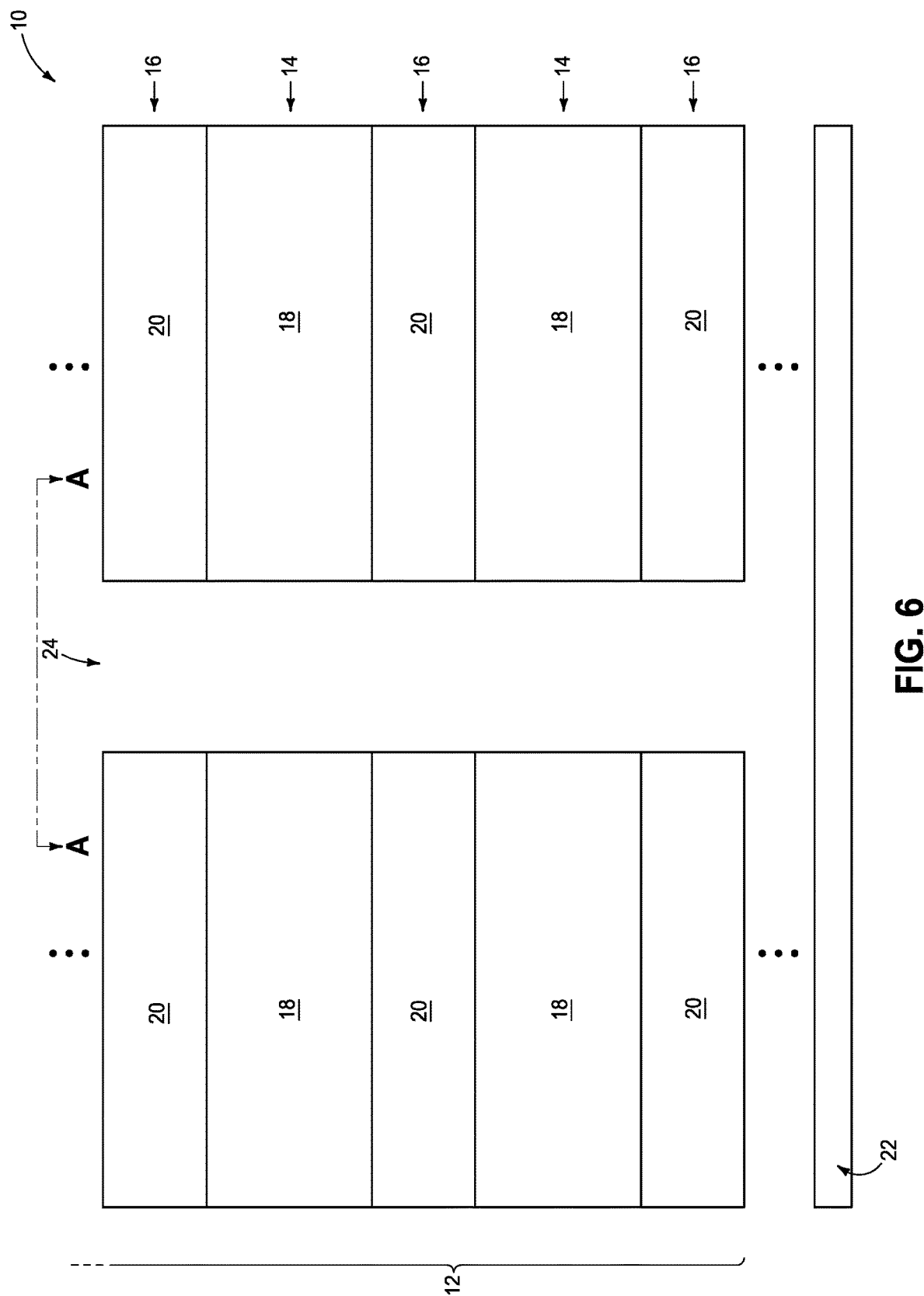
Figure 6A:
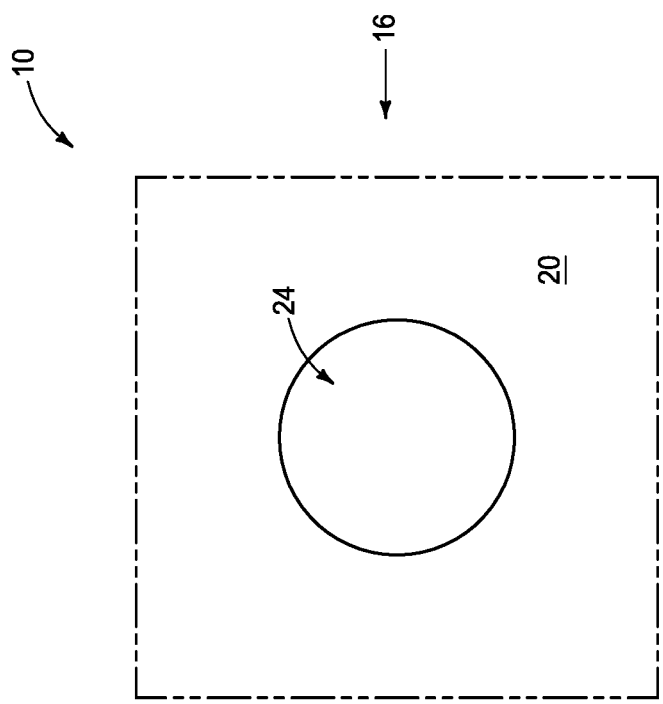
FIGS. 6A and 15A are diagrammatic top views along the lines A-A of FIGS. 6 and 15, respectively.

Referring to FIG. 6, an opening 24 is formed through the stack 12. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 16 of the illustrated region of construction 10, and illustrates an example configuration in which the opening 24 is circular-shaped when viewed from above. In some embodiments, the opening 24 may be referred to as a first opening in order to distinguish it from other openings formed at later process stages. The pillar opening 24 may be representative of a large plurality of substantially identical openings formed across the base 22 at the processing stage of FIG. 6 (with the term "substantially identical" meaning identical to within reasonable tolerances of fabrication and measurement).

Referring to FIG. 7, the material 20 of the second levels 16 is recessed along the opening 24 to form gaps (i.e., cavities) 26. The gaps 26 may be referred to as first gaps to distinguish them from other gaps formed at subsequent process stages.

In some embodiments, the material 20 of the second levels 16 may comprise, consist essentially of, or consist of silicon dioxide; and the material 18 of the first levels 14 may comprise, consist essentially of, or consist of silicon nitride. In such embodiments, the material 20 may be selectively etched relative to the material 18 utilizing a buffered oxide etch (e.g., an etch utilizing a hydrofluoric acid and a buffering agent, such as ammonium fluoride). The term "selective etching" means that one material is removed faster than another material, and includes, but is not limited to, etching processes which are 100% selective for one material relative to another.

The first gaps 26 are vertically between segments 28 of the material 18 of the first levels 14.

The first gaps extend into the second levels 16 to a depth D1. Such depth may be any suitable depth, and in some embodiments will be within a range of from about 5 nm to about 20 nm.

In the shown embodiment, the etching utilized to form the gaps 26 rounds corners of material 18 of the first levels 14.

In the shown embodiment, front surfaces of material 20 are curved and concave at the processing stage of FIG. 7. In other embodiments, such front surfaces may be convex, straight, or any other suitable shape.

Figure 8:
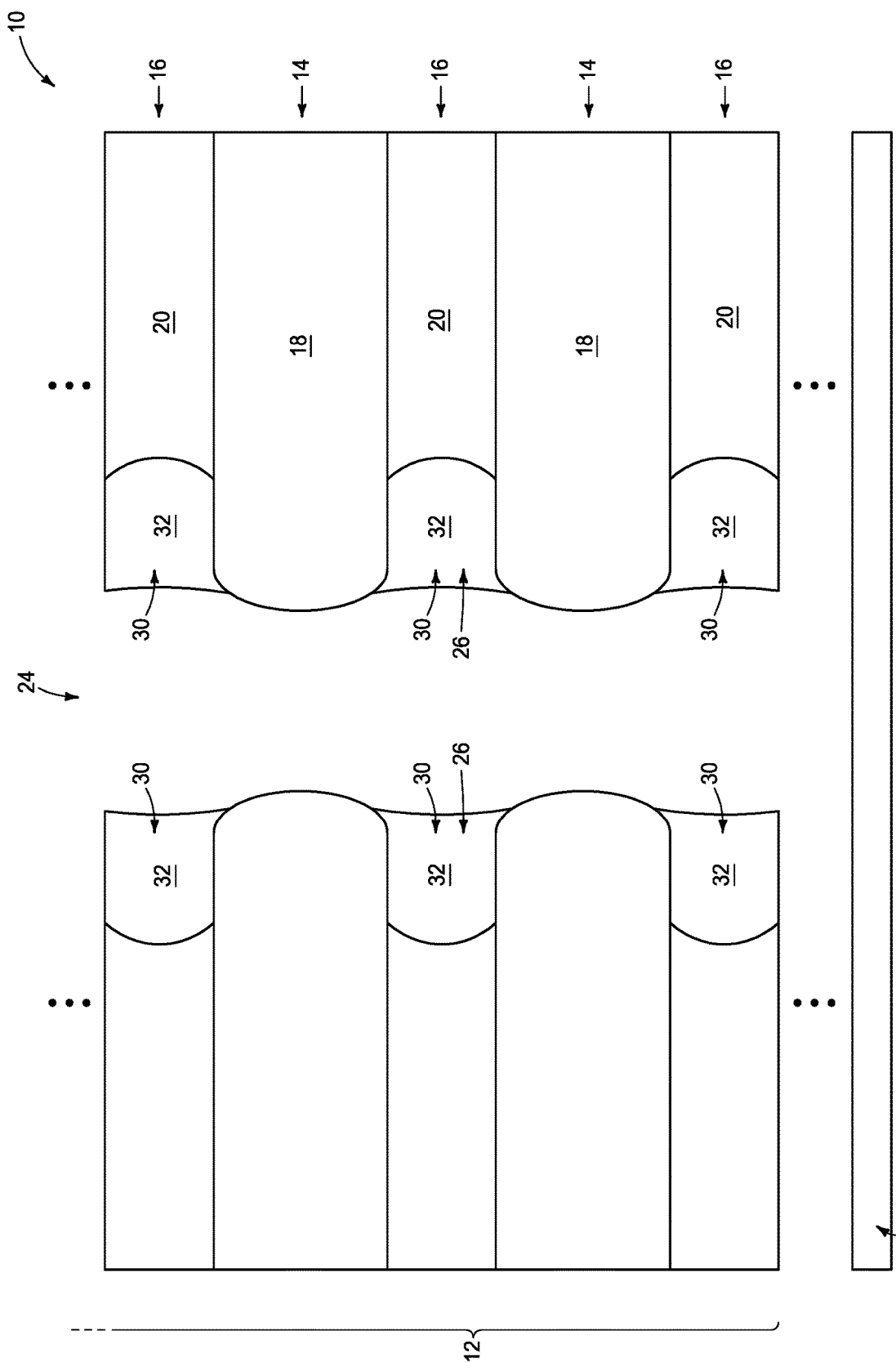

Referring to FIG. 8, protective structures 30 are formed within the first gaps. The protective structures 30 may be referred to as first protective structures to distinguish them from other protective structures formed at subsequent process stages. The protective structures 30 comprise material 32. Such material may comprise any suitable composition(s); and in some embodiments may comprise silicon. For instance, in some example embodiments, the material 32 may comprise, consist essentially of, or consist of polycrystalline silicon.

The material 32 may be formed within the gaps 26 with any suitable processing. For instance, in some embodiments the material 32 may be deposited through the opening 24 and into the gaps 26; resulting in the gaps 26 being filled with the material 32 and the opening 24 being at least partially filled with the material 32 (and in some embodiments being substantially entirely filled with the material 32). Subsequently, an etch may be utilized to remove excess material 32 from within the opening 24, while leaving the material 32 within the gaps 26. The etch may utilize any suitable etchant and etching conditions. In some example embodiments, the etch utilizes tetramethylammonium hydroxide (TMAH).

Figure 9:
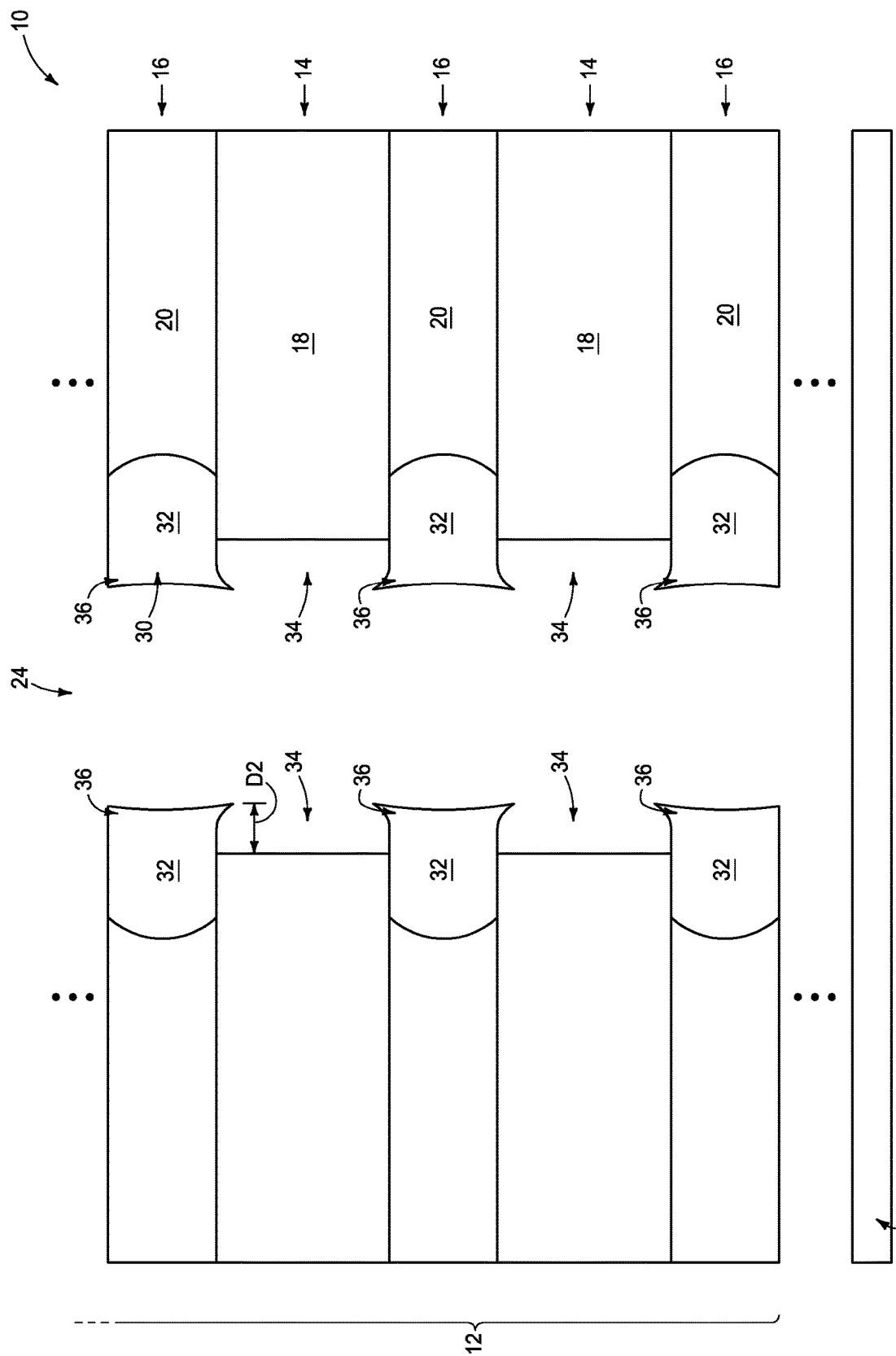

Referring to FIG. 9, the material 18 of the first levels 14 is recessed along the opening 24 to form second gaps 34. In some embodiments, the material 18 of the first levels 14 may comprise, consist essentially of, or consist of silicon nitride; and the material 32 of the protective structures 30 may comprise, consist essentially of, or consist of polycrystalline silicon. In such embodiments, the material 18 may be selectively etched relative to the material 32 utilizing phosphoric acid. The gaps 34 are vertically between segments 36 of the material 32 of the protective structures 30. In some embodiments, the processing of FIG. 9 is optional and may be omitted.

The second gaps 34 extend into the first levels 14 to a depth D2. Such depth may be any suitable depth, and in some embodiments will be within a range of from about 1 nm to about 10 nm.

Figure 10:
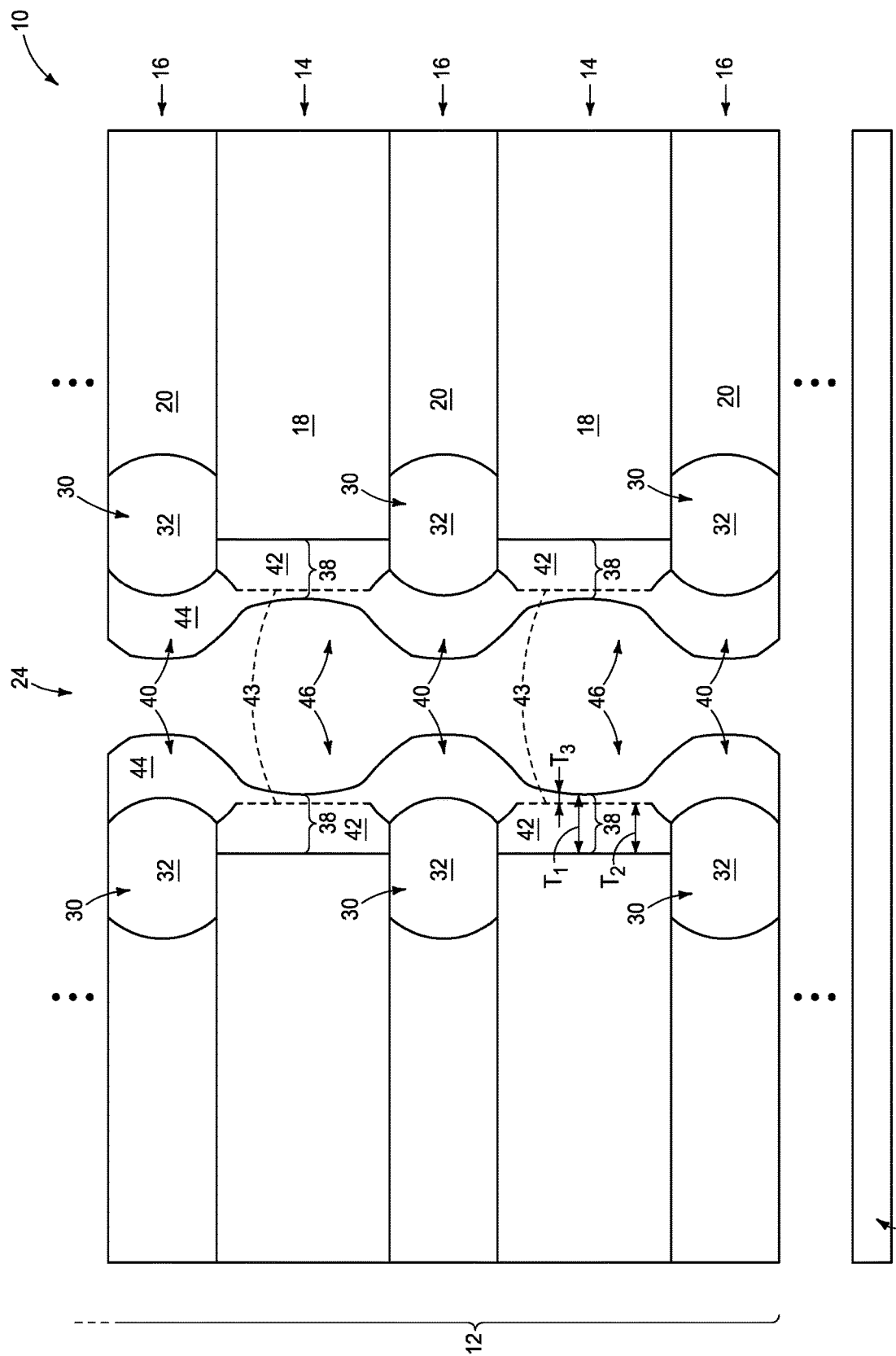

Referring to FIG. 10, the surfaces within opening 24 are exposed to oxidizing conditions which oxidize edges of the first levels 14 to form charge-blocking regions 38, and which also oxidize edges of the protective structures 30 to form the ledges 40. The oxidizing conditions may utilize any suitable chemistry and operational parameters. In some example embodiments, the oxidizing conditions may comprise an operational temperature of the oxidizing ambient and/or the oxidizing surfaces of at least about 700° C. (but not limited to being at least about 700°, and may be lower if suitable oxidative conditions achieve desired electrical and/or other properties). The oxidizing conditions may, for example, utilize steam (for instance, in situ steam generation (ISSG)) as a source of the oxidant, and/or may utilize plasma to generate oxidizing species. The plasma may be a so-called "remote plasma", meaning that the plasma does not contact the surfaces within opening 24 which are to be oxidized, but instead only the oxidizing species generated by such plasma reach the oxidizing surfaces. In some embodiments, at least portions of the charge-blocking regions 38 and/or ledges 40 may be formed by deposition of suitable material(s) (e.g., silicon dioxide), followed by appropriate etching to achieve a desired shape (such as, for example, shapes analogous to the shapes of the charge-blocking regions 38 and ledges 40 shown in FIG. 10).

The oxidation of the materials 18 and 32 only oxidizes portions of the materials 18 and 32 in the illustrated embodiment, and leaves remaining portions of the materials 18 and 32 which are not oxidized.

In some embodiments, the material 18 of the first levels 14 comprises, consists essentially of, or consist of silicon nitride; and the material 32 of the protective structures 30 comprises, consists essentially of, or consists of polycrystalline silicon. The oxidation may oxidize edges of the silicon nitride 18 to form silicon oxynitride 42 and silicon dioxide 44; and may oxidize the edges of polycrystalline silicon 32 to form additional silicon dioxide 44. In such embodiments, the charge-blocking regions 38 may comprise the silicon oxynitride 42 and the silicon dioxide 44 (as shown). A boundary between the materials 42 and 44 within a charge-blocking region 38 is diagrammatically illustrated in FIG. 10 with a dashed-line 43. The dashed-line 43 is used to indicate that the boundary between the materials 42 and 44 may be an abrupt interface between the silicon oxynitride and the silicon dioxide, or may be a gradient.

The charge-blocking regions 38 extend vertically, and have horizontal thicknesses T1. Such horizontal thicknesses may be of any suitable dimension, and in some embodiments may be within a range of from about 50 Å to about 150 Å. The silicon oxynitride material 42 of the charge-blocking regions has a horizontal thickness T2; and the silicon dioxide material 44 of the charge-blocking regions has a horizontal thickness T3. In some embodiments, the horizontal thickness T2 will be at least about double the horizontal thickness T3. In some embodiments, the horizontal thickness T2 will be within a range of from about 20 angstroms (Å) to about 140 Å; and the horizontal thickness T3 will be within a range of from about 10 Å to about 30 Å. In some embodiments, the horizontal thicknesses T2 and T3 may be referred to as first and second horizontal thicknesses, respectively, in order to distinguish them from one another.

The oxidation of materials 32 and 18 may oxidize the polycrystalline silicon material 32 much faster (with corresponding volume expansion) as compared to the silicon nitride material 18 (for instance, may oxidize the polycrystalline silicon at least about 1.5 times as fast as the silicon nitride, at least about twice as fast as the silicon nitride, at least about three times as fast as the silicon nitride, etc.). Accordingly, the silicon dioxide 44 may be substantially thicker along the material 32 than are the combined materials 42/44 along the material 18; and thus, there may be much more expansion along the second levels 16 than along the first levels 14. In embodiments in which the oxidation induces much more expansion from the silicon dioxide 44 formed from the polycrystalline silicon material 32 than from the silicon oxynitride 42/silicon dioxide 44 formed from the silicon nitride material 18, the edges of the tiers 14 along the opening 24 may expand little, if at all, and edges of the tiers 16 along the opening 24 may expand substantially (e.g., the expansion due to the formation of the silicon dioxide 44 from polycrystalline silicon material 32 may be at least about double the expansion due to the formation of the silicon oxynitride 42/silicon dioxide 44 from the silicon nitride material 18). In some embodiments there may be substantial expansion along the edges of the tiers 16 along the opening 24, and there may be substantially no expansion along the edges of the tiers 14 along the opening 24 (with the term "substantially no expansion" meaning no expansion to within reasonable tolerances of detection). The thick silicon dioxide 44 along the second levels 16 is configured as the ledges 40. Third gaps 46 are along the first levels 14, and are vertically between the ledges 40.

Figure 11:
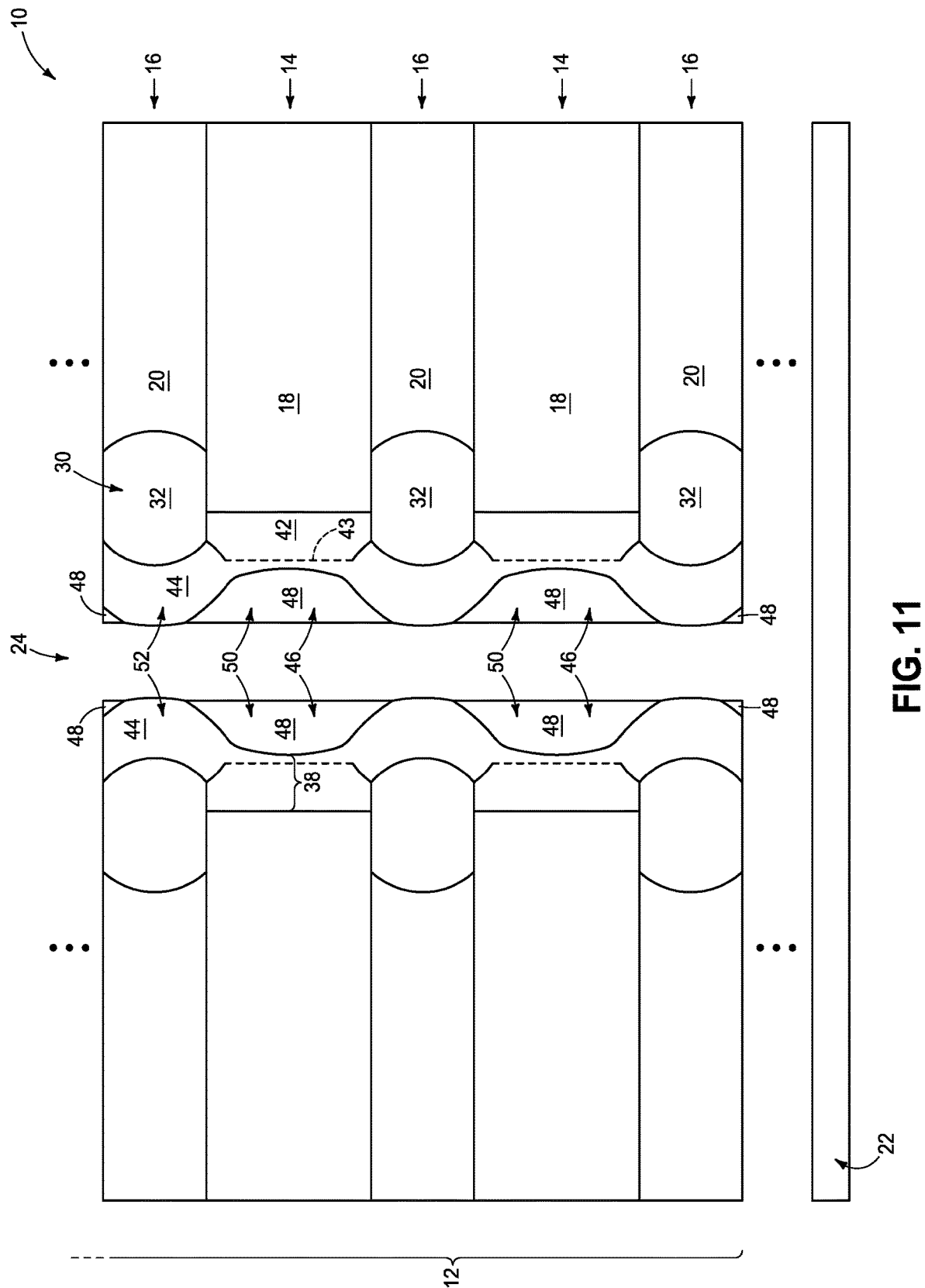

Referring to FIG. 11, charge-storage material 48 is formed within the gaps 46. The charge-storage material 48 may comprise any suitable composition(s); and in some embodiments may comprise charge-trapping materials, such as silicon nitride, silicon oxynitride, conductive nanodots, etc. Persons of ordinary skill in the art understand the term "charge-trapping"; and will understand that a "charge trap" may refer to an energy well that can reversibly capture a charge carrier (e.g., an electron or hole). In alternative embodiments (not shown), the charge-storage material 48 may be configured as floating gate material (such as, for example, polycrystalline silicon).

The charge-storage material 48 may be formed in the shown configuration with any suitable methodology. For instance, in some embodiments the charge-storage material 48 may comprise, consist essentially of, or consist of silicon nitride, and may be initially formed to fill the gaps 46 and to extend into the opening 24. Excess material 48 may then be removed with a suitable etch (for instance, an etch utilizing hot phosphoric acid, an etch utilizing oxidation followed by hydrofluoric acid treatment, etc.) to leave only the material 48 which is confined within the gaps 46.

In some embodiments, the charge-storage material 48 within the gaps 46 may be considered to be configured as charge-storage regions (e.g., charge-trapping regions) 50. Such charge-trapping regions are along, and directly adjacent, the silicon dioxide 44 of the charge-blocking regions 38.

Figure 12:
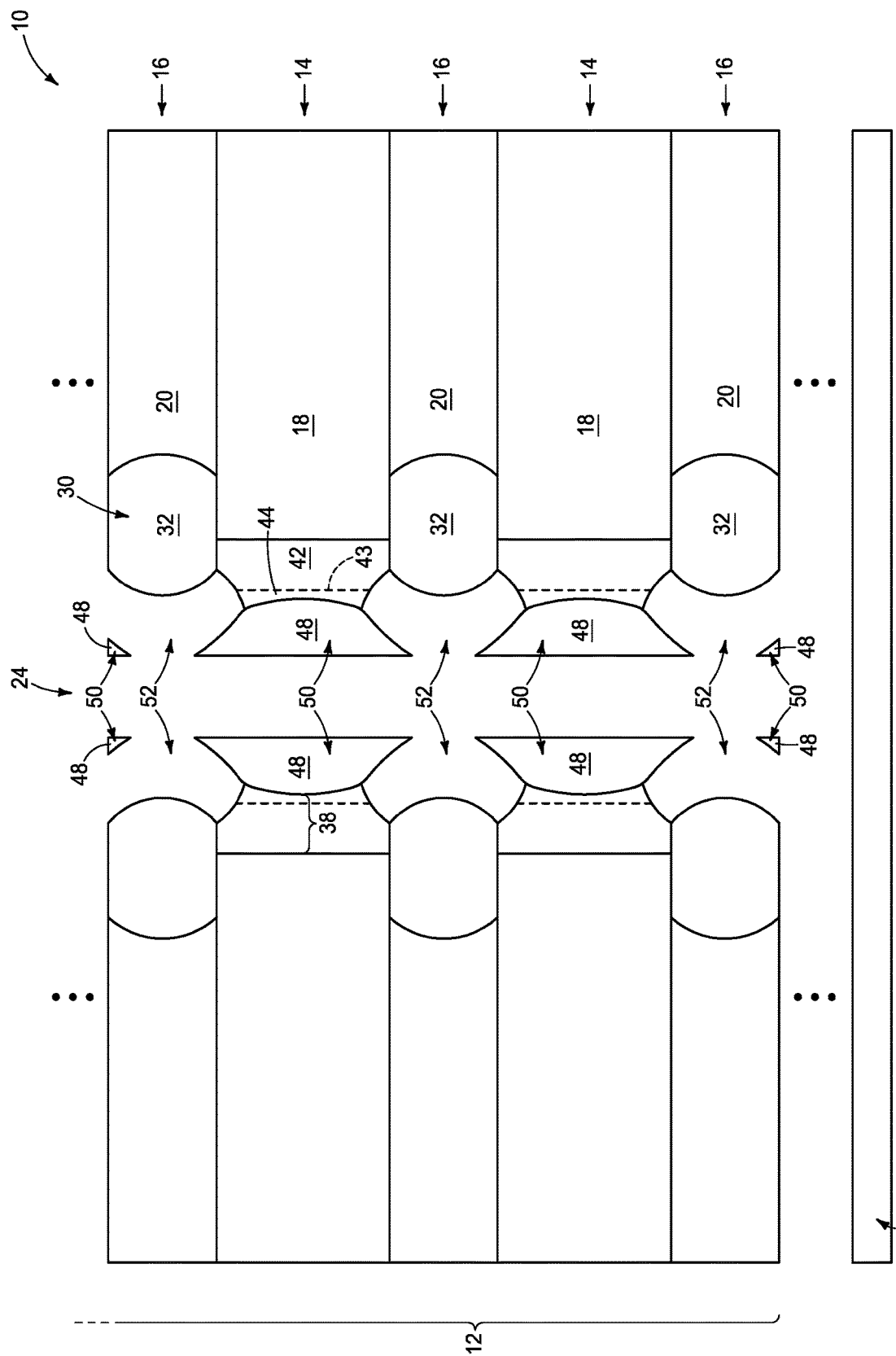

Referring to FIG. 12, the silicon dioxide 44 between the charge-trapping regions 50 is removed with a suitable etch (for instance, an etch utilizing hydrofluoric acid) selectively to 48 (silicon nitride, for instance) and 32 (polycrystalline silicon, for instance), leaving fourth gaps 52 vertically between the charge-trapping regions 50.

Figure 13:
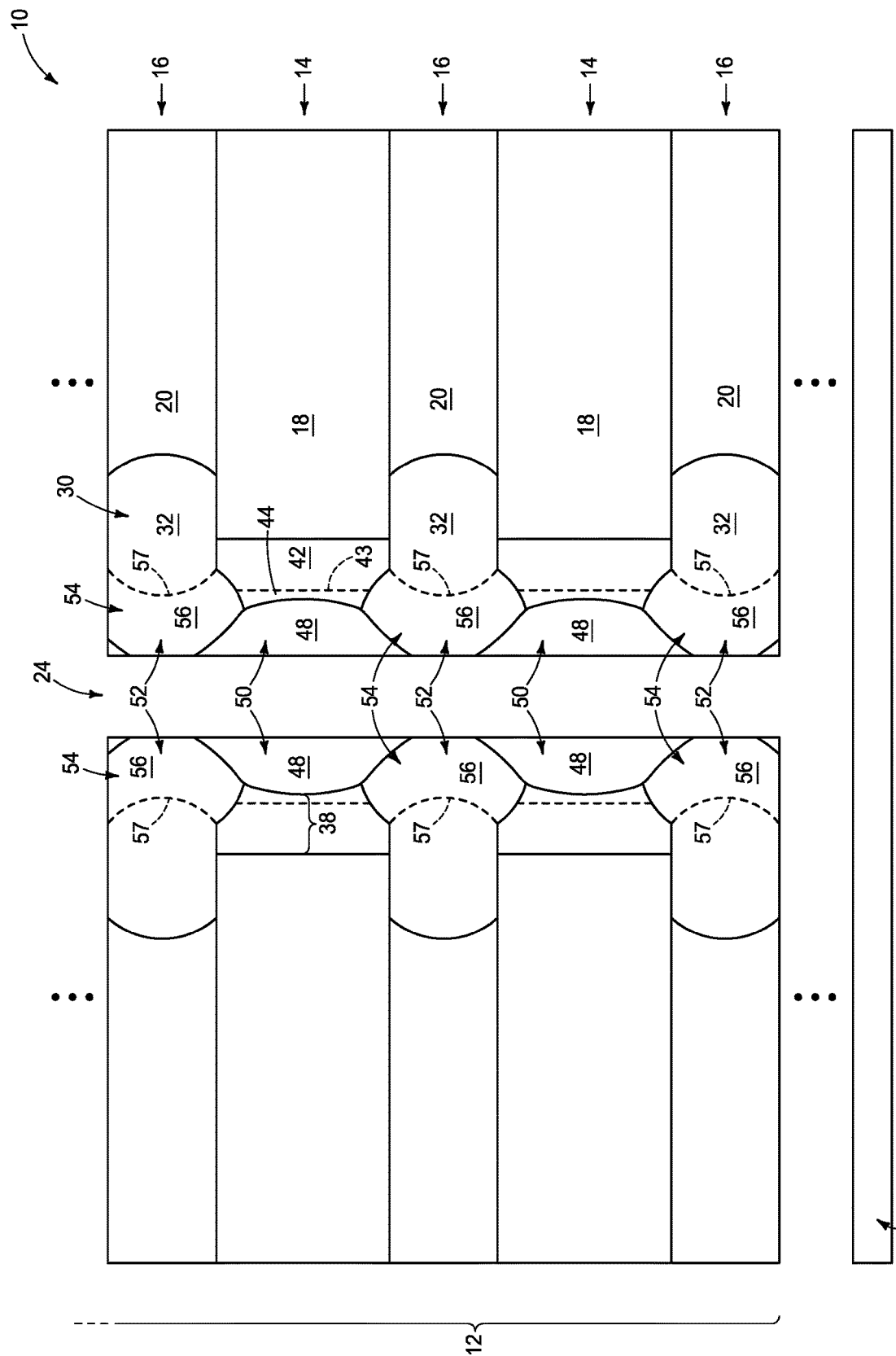

Referring to FIG. 13, second protective structures 54 are formed within the fourth gaps 52. The second protective structures 54 comprise a material 56. Such material may comprise any suitable composition(s); and in some embodiments will comprise a same composition as the material 32 of the first protective structures 30. For instance, in some embodiments the materials 56 and 32 may both comprise, consist essentially of, or consist of polycrystalline silicon. Dashed-lines 57 are utilized to diagrammatically illustrate approximate boundaries between the materials 32 and 56, and to indicate that the materials 32 and 56 may or may not be the same as one another. The materials 32 and 56 are directly adjacent to one another.

The material 56 may be formed to be contained within the gaps 52 with any suitable processing. For instance, in some embodiments the material 56 may comprise polycrystalline silicon, and may be initially formed to fill the gaps 52 and to extend within opening 24. Subsequently, excess material 56 may be removed with a suitable etch (for instance, an etch utilizing tetramethyl ammonium hydroxide (TMAH)) to leave the configuration in which the material 56 is contained within the gaps 52.

Figure 14:
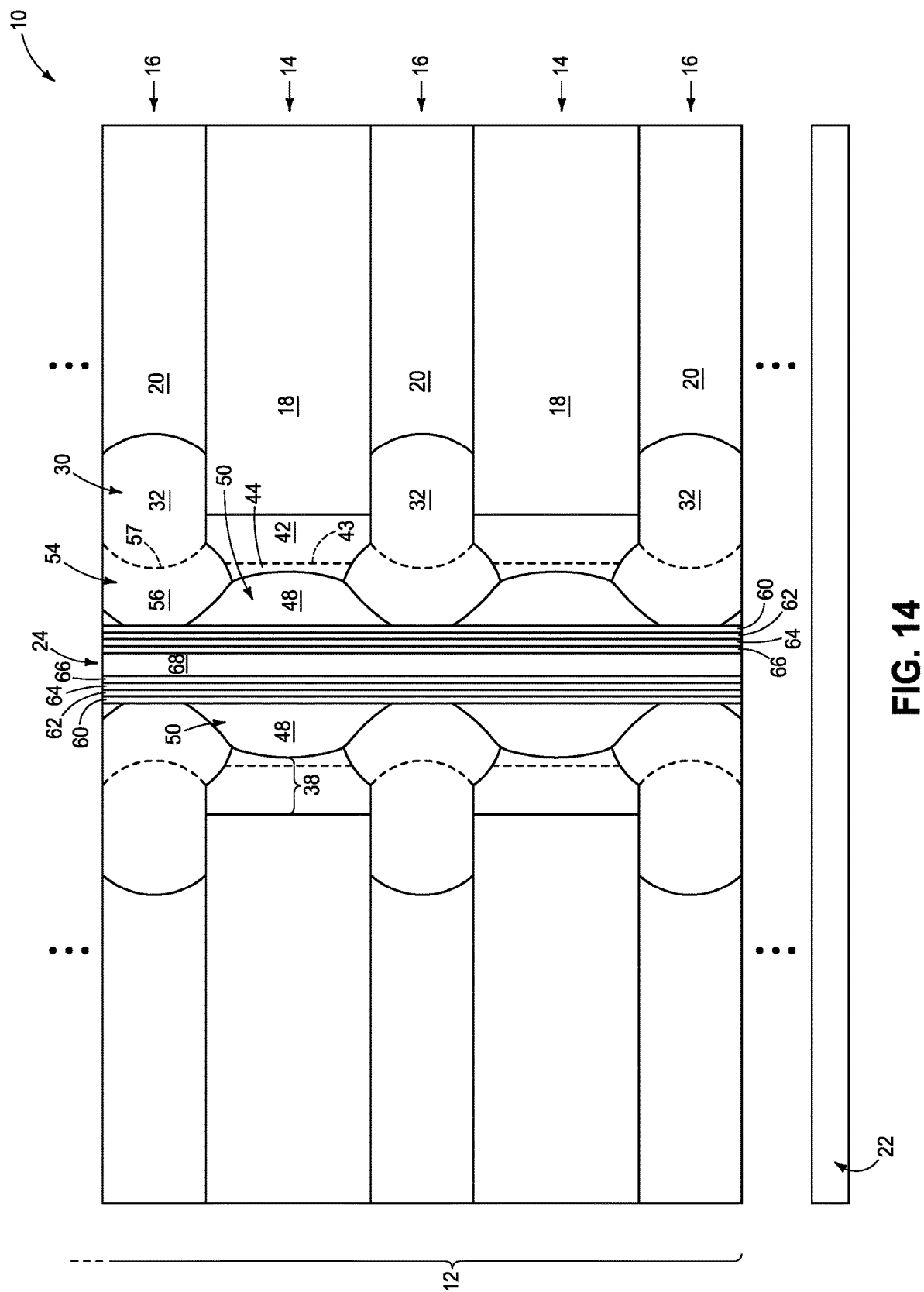

Referring to FIG. 14, tunneling materials 60, 62 and 64 are formed along an outer periphery of the opening 24. In the illustrated embodiment, the tunneling material 60 extends along, and directly against, edges of the second protective material 56, and edges of the charge-storage material 48.

The tunneling materials can function as materials through which charge carriers tunnel or otherwise pass during programming operations, erasing operations, etc. In some contexts, one or more of the tunneling materials may be referred to as gate dielectric material, or simply as dielectric material. In the illustrated embodiment, three tunneling materials are utilized. In other embodiments, there may be fewer than three tunneling materials; and in yet other embodiments there may be more than three tunneling materials. In some embodiments, the tunneling materials 60, 62 and 64 may be band-gap engineered to have desired charge tunneling properties. The tunneling material 62 is compositionally different from the materials 60 and 64. The materials 60 and 64 may be compositionally different from one another in some embodiments, and may be compositionally the same as one another in other embodiments.

In some example embodiments, the tunneling material 62 may comprise silicon nitride, and the tunneling materials 60 and 64 may comprise silicon dioxide. In some example embodiments, the tunneling material 60 may comprise one or both of silicon oxynitride and silicon dioxide, the tunneling material 62 may comprise silicon nitride, and the tunneling material 64 may comprise silicon dioxide.

In some embodiments, the tunneling materials 60, 62 and 64 may be referred to as first, second and third tunneling materials, respectively.

Channel material 66 is formed within the opening 24 and along the tunneling materials 60, 62 and 64. In the illustrated embodiment, the channel material 66 is directly against the tunneling material 64. The channel material 66 may comprise any suitable appropriately-doped semiconductor material(s); and in some embodiments may comprise one or more of silicon, germanium, III/V semiconductor materials (e.g., gallium phosphide), etc.

In the illustrated embodiment, the channel material 66 lines a periphery of the opening 24, and insulative material 68 fills a remaining interior region of the opening 24. The insulative material 68 may comprise any suitable composition or combination of compositions, such as, for example, silicon dioxide. The illustrated configuration of the channel material 66 may be considered to be a hollow channel configuration, in that the insulative material 68 is provided within a "hollow" in the channel configuration. In other embodiments, the channel material may be configured as a solid pillar.

The channel material 66 extends vertically along the periphery of opening 24; or, in other words, extends vertically through the stack 12.

Figure 15:
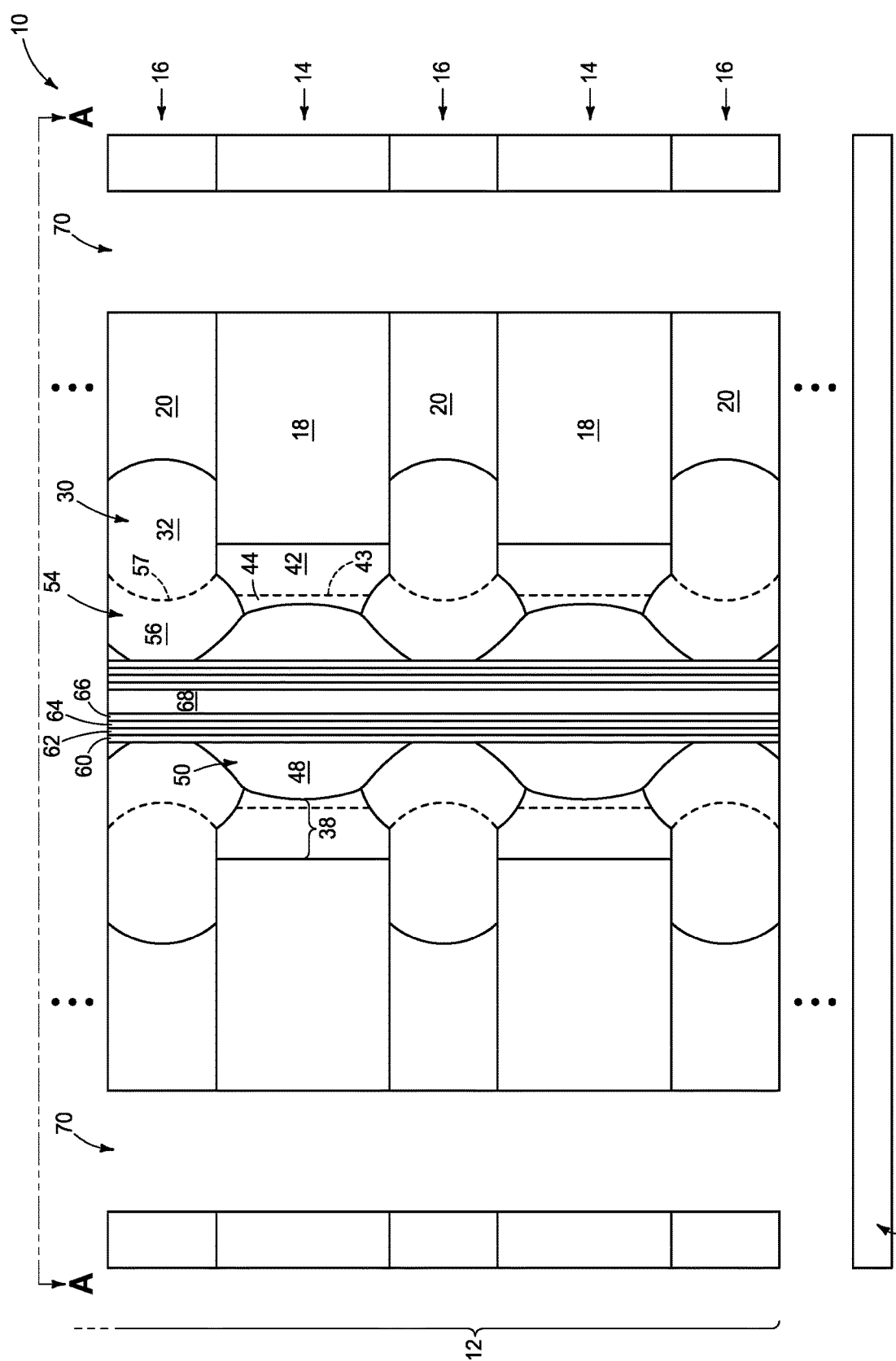

Referring to FIG. 15, second openings 70 are formed through the stack 12. The second openings 70 extend through the portions of material 18 that remain after the oxidation (FIG. 10) utilized to form the charge-blocking regions 38.

Figure 15A:
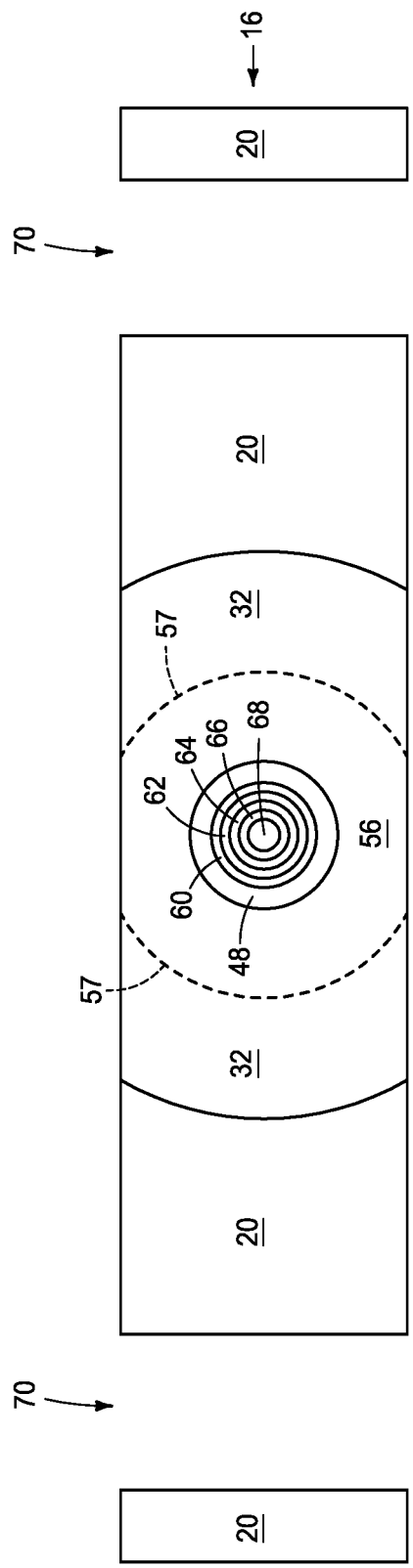

FIG. 15A shows a top view of a portion of the top level 16 of the illustrated region of construction 10, and illustrates an example configuration in which the second openings 70 are configured as slits (i.e., trenches).

Referring to FIG. 16, the nitride 18 of the first levels 14 is recessed along second openings 70 (for instance, utilizing phosphoric acid etching), and then the oxide 20 of the second levels 16 is shaped with a wet etch (for instance, a buffered oxide etch). The shaped second levels 16 comprise projections 72 along the peripheries of the second openings 70. The etch-front surface of the sides of the protrusion may be straight, convex or concave; with FIG. 16 showing an example of the "concave" case.

Figure 17:
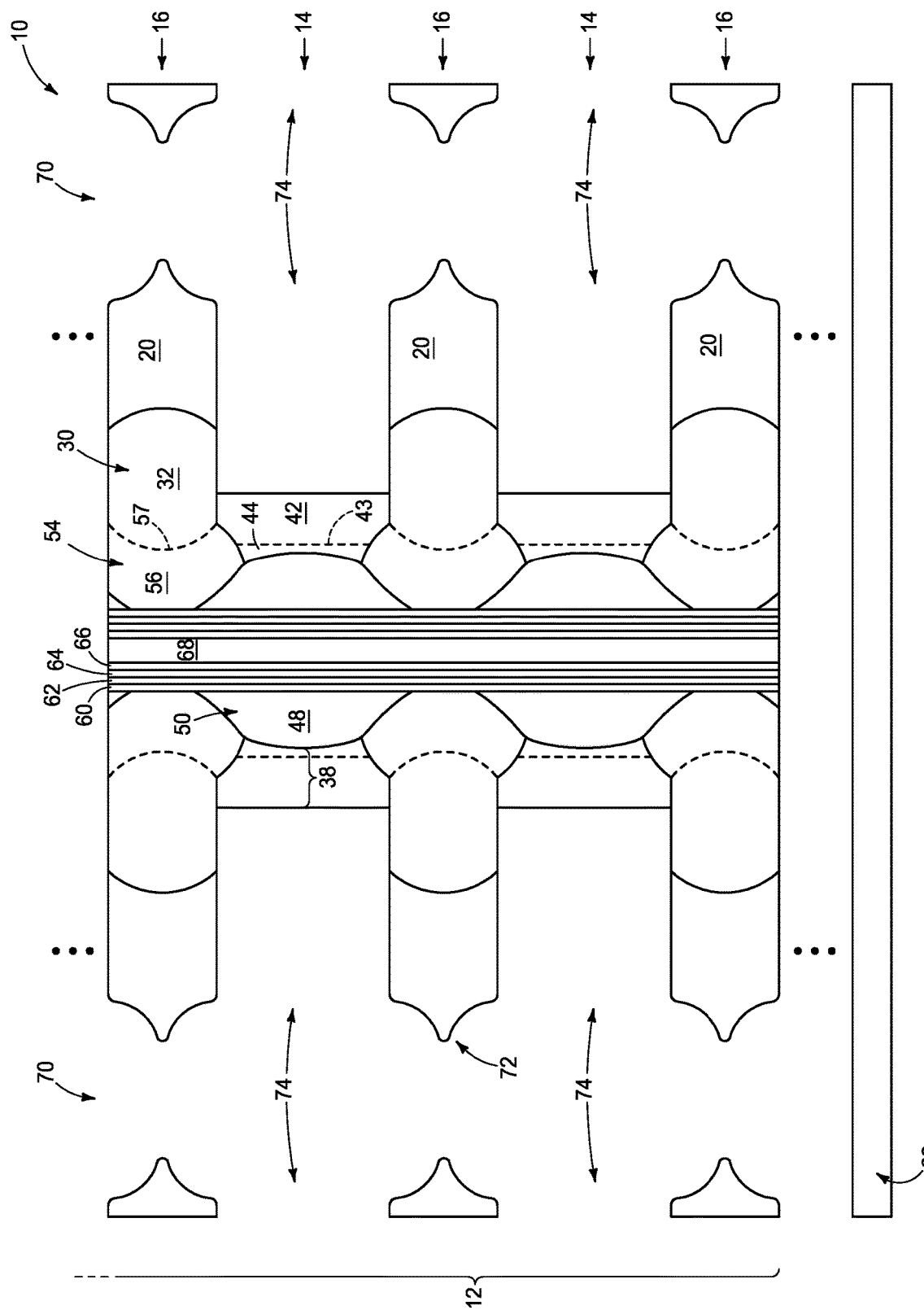

Referring to FIG. 17, the material 18 (FIG. 16) exposed along the sides of openings 70 is removed to leave cavities 74. Such removal may utilize any suitable processing, and in some embodiments may utilize a wet etch with phosphoric acid.

Figure 18:
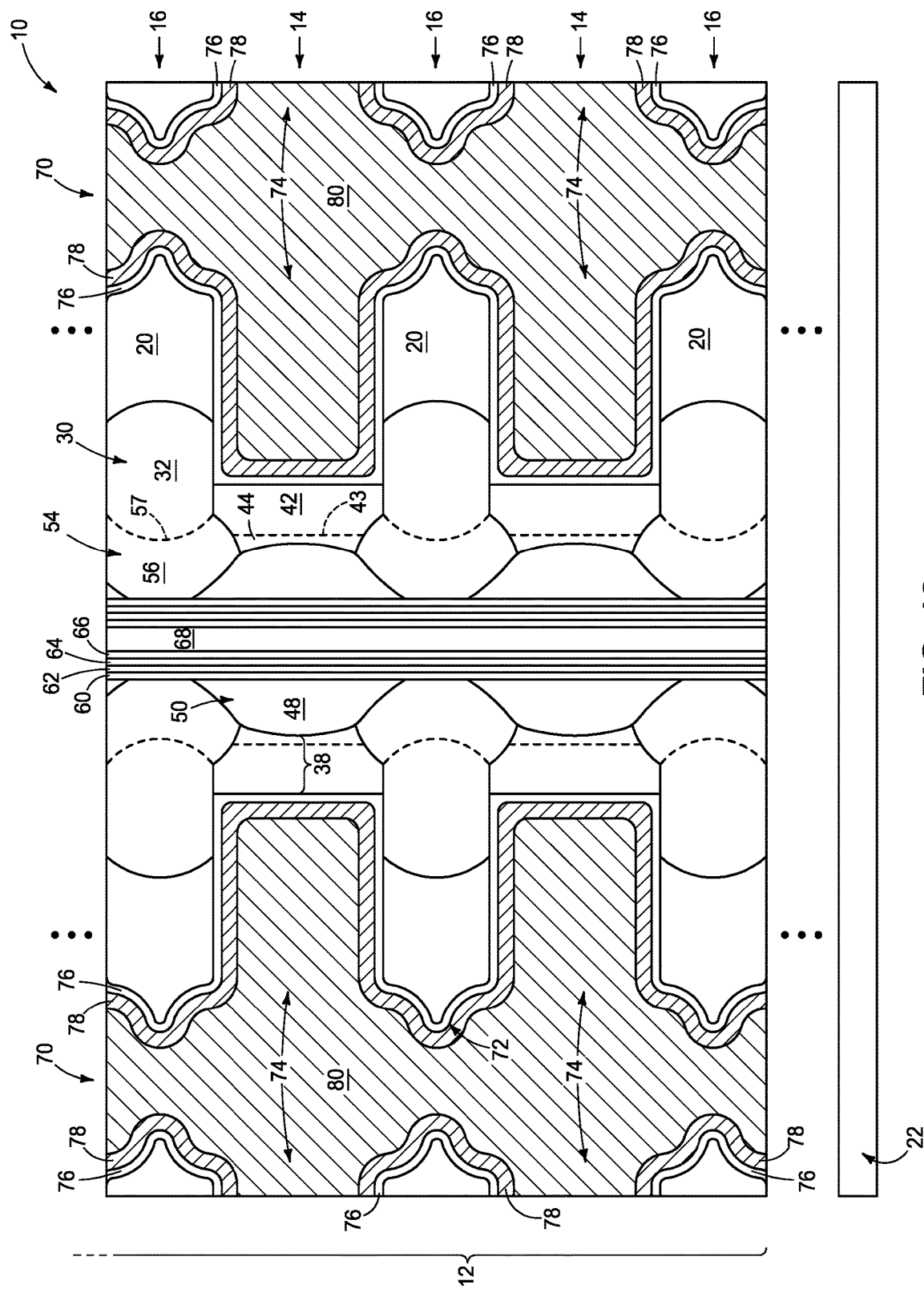

Referring to FIG. 18, dielectric barrier material 76 is deposited within the openings 70. The dielectric barrier material 76 lines peripheral edges of the openings 70, and lines peripheral edges of the cavities 74. The dielectric barrier material 76 may comprise any suitable composition(s); and in some embodiments may comprise one or more high-k materials (with the term high-k meaning a dielectric constant greater than that of silicon dioxide). Example compositions which may be incorporated into the dielectric barrier material are hafnium oxide, zirconium oxide, aluminum oxide, hafnium silicate, zirconium silicate, titanium oxide, gadolinium oxide, niobium oxide, tantalum oxide etc.

Conductive materials 78 and 80 are provided within the lined openings 70 and the lined cavities 74. The conductive materials 78 and 80 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 78 may comprise, consist essentially of, or consist of titanium nitride; and the conductive material 80 may comprise, consist essentially of, or consist of tungsten.

Figure 19:
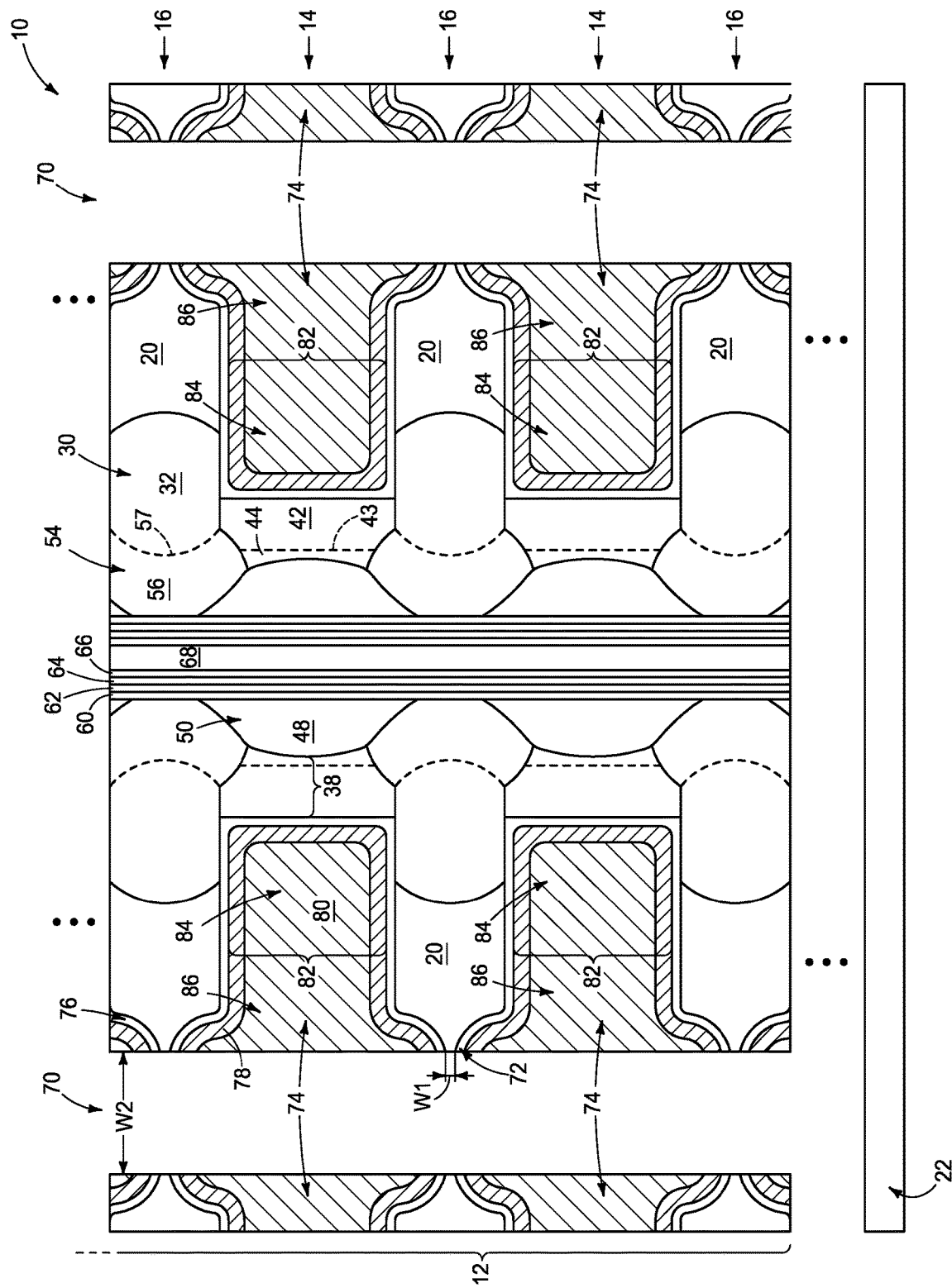

Referring to FIG. 19, conductive materials 78 and 80 are removed from within central regions of openings 70, while leaving the conductive materials 78 and 80 within the cavities 74.

The conductive materials 78 and 80 remaining within the cavities 74 together form conductive regions 82. Although the illustrated conductive regions comprise two conductive materials, in other embodiments analogous conductive regions may comprise only a single conductive material, or may comprise more than two conductive materials.

Terminal portions of the conductive regions 82 within the cavities 74 may correspond to conductive gates 84, and other portions of the conductive regions 82 may correspond to wordlines 86. The wordlines are along the levels 14, and accordingly in some embodiments the levels 14 and may be referred to as wordline levels. Such wordline levels may be considered to alternate with the insulative levels 16 within the stack 12 of FIG. 19.

Outer segments of the projections 72 of oxide 20 are exposed along the edges of openings 70 during the etching utilized to remove the conductive materials 78 and 80. In some embodiments, the exposed segments of the projections 72 have vertical dimensions W1 within a range of from about 5 nm to about 20 nm. In contrast, the openings 70 have horizontal dimensions W2 within a range of from about 250 nm to about 1000 nm. The substantial difference between W1 and W2 may be of benefit in subsequent processing, as described below with reference to FIG. 22.

Figure 20:
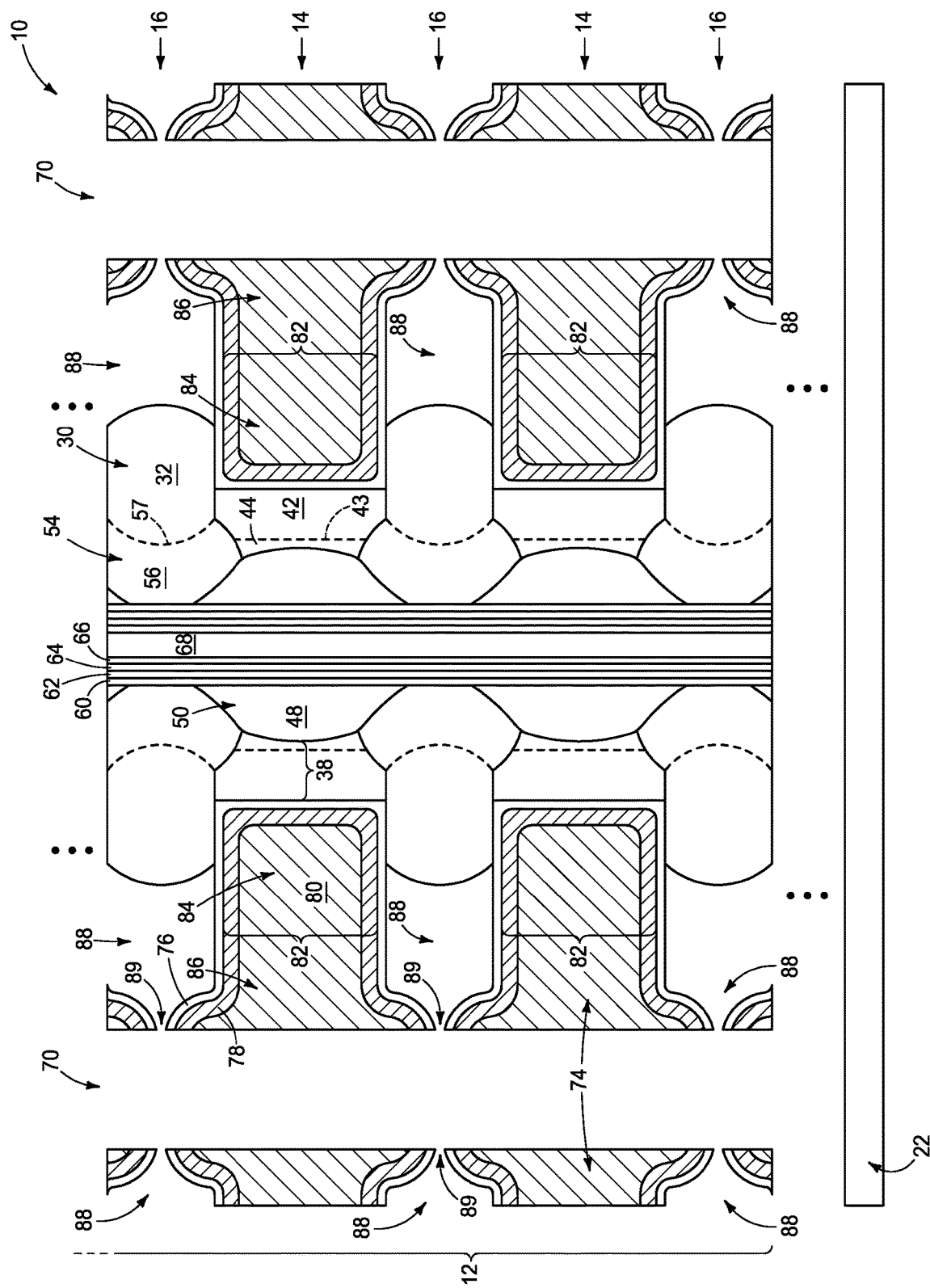

Referring to FIG. 20, the second material 20 (FIG. 19) is removed with an appropriate etch (e.g., a buffered oxide etch) to leave voids 88. The protective structures 30 and 54 protect the charge-blocking regions 38 from being exposed to the etching utilized to remove the second material 20. For instance, in some embodiments the second material 20 comprises silicon dioxide, and the charge-blocking regions comprise silicon oxynitride and silicon dioxide. A buffered oxide etch (e.g., an etch utilizing hydrofluoric acid) may be utilized to remove the second material 20. Such etch would also remove the silicon oxynitride 42 and the silicon dioxide 44 of the charge-blocking regions 38. The etch may remove the silicon oxynitride 42 much slower than silicon dioxide of the second material 20. However, the duration of the etch utilized to remove material 20 may be long enough that a significant amount of the silicon oxynitride 42 would be removed. Also, different amounts of the silicon oxynitride may be removed from the various charge-blocking regions 38, leading to non-uniformity across a memory array. The protective structures 30 and 54 may thus prevent adverse consequences which may otherwise occur in embodiments omitting such protective structures.

The voids 88 have orifices 89 extending to the openings 70. Such orifices have the vertical dimensions W1 described above with reference to FIG. 19.

Figure 21:
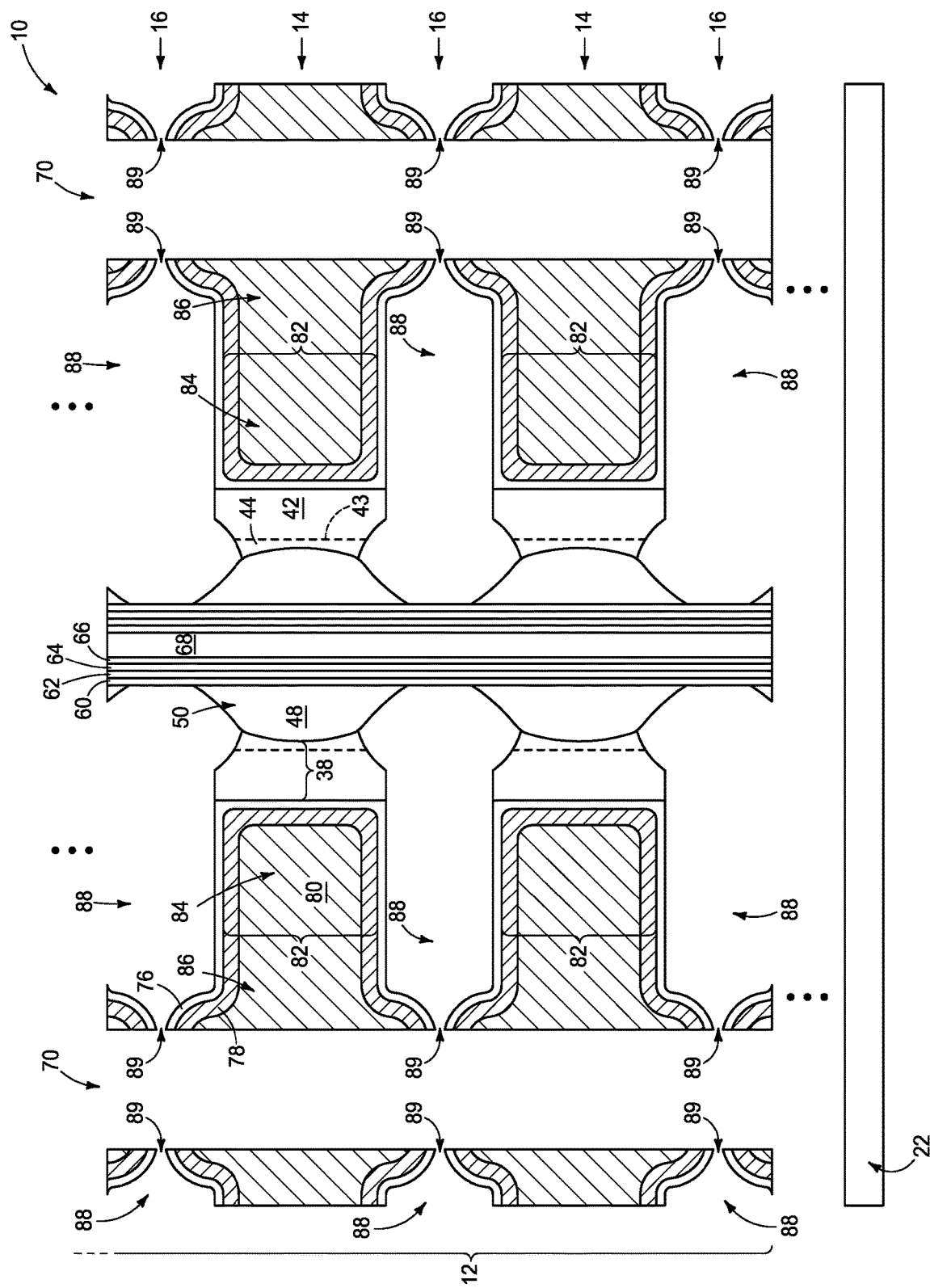

Referring to FIG. 21, the protective structures 30 and 54 (FIG. 19) are removed to extend the voids 88. In some embodiments, the protective structures 30 and 54 comprise polycrystalline silicon. Such may be removed with an etch utilizing TMAH, which may be highly selective for the polycrystalline silicon relative to the silicon oxynitride and the silicon dioxide of the charge-blocking regions 38.

Figure 22:
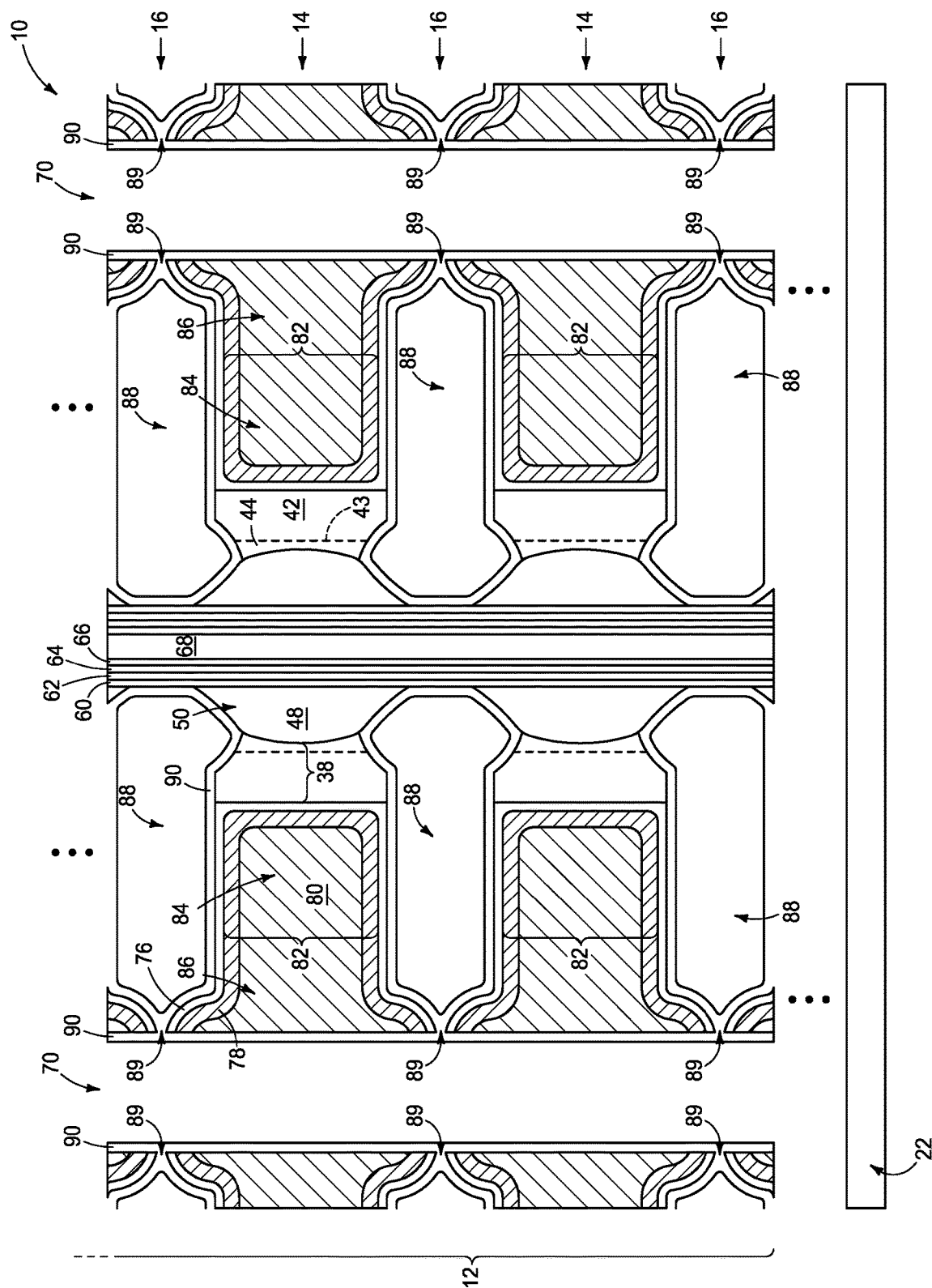

Referring to FIG. 22, insulative material 90 is deposited to line outer peripheries of the voids 88 (or, in some embodiments, the insulative material 90 may be only along the entrance portions of the orifices, closing the entrances before any substantial amount of deposition chemistry passes through the orifices). The insulative material 90 may comprise any suitable composition(s); and in some embodiments may comprise, consist essentially of, or consist of silicon oxide. The insulative material 90 may be deposited utilizing any suitable deposition methodology; including, for example, one or both of chemical vapor deposition (CVD), atomic layer deposition (ALD). In some embodiments, the insulative material 90 may correspond to silicon dioxide deposited utilizing a CVD process with tetraethylorthosilicate (TEOS) as a precursor.

An advantage of utilizing voids 88 within a memory array may be that the voids have a very low dielectric constant as compared to other insulative materials which may alternatively be utilized in the memory array. However, a difficulty which may be encountered in attempting to line the voids with insulative material is that the insulative material may pinch off within the openings 70 before all of the voids have been adequately sealed across the orifices 89. The illustrated embodiment may address such difficulty by utilizing orifices 89 which are very narrow relative to the width of the opening 70. Accordingly, all of the orifices 89 may be sealed with the insulative material 90 (as shown in FIG. 22) before the insulative material has closed the openings 70 (and/or voids 88).

Figure 23:
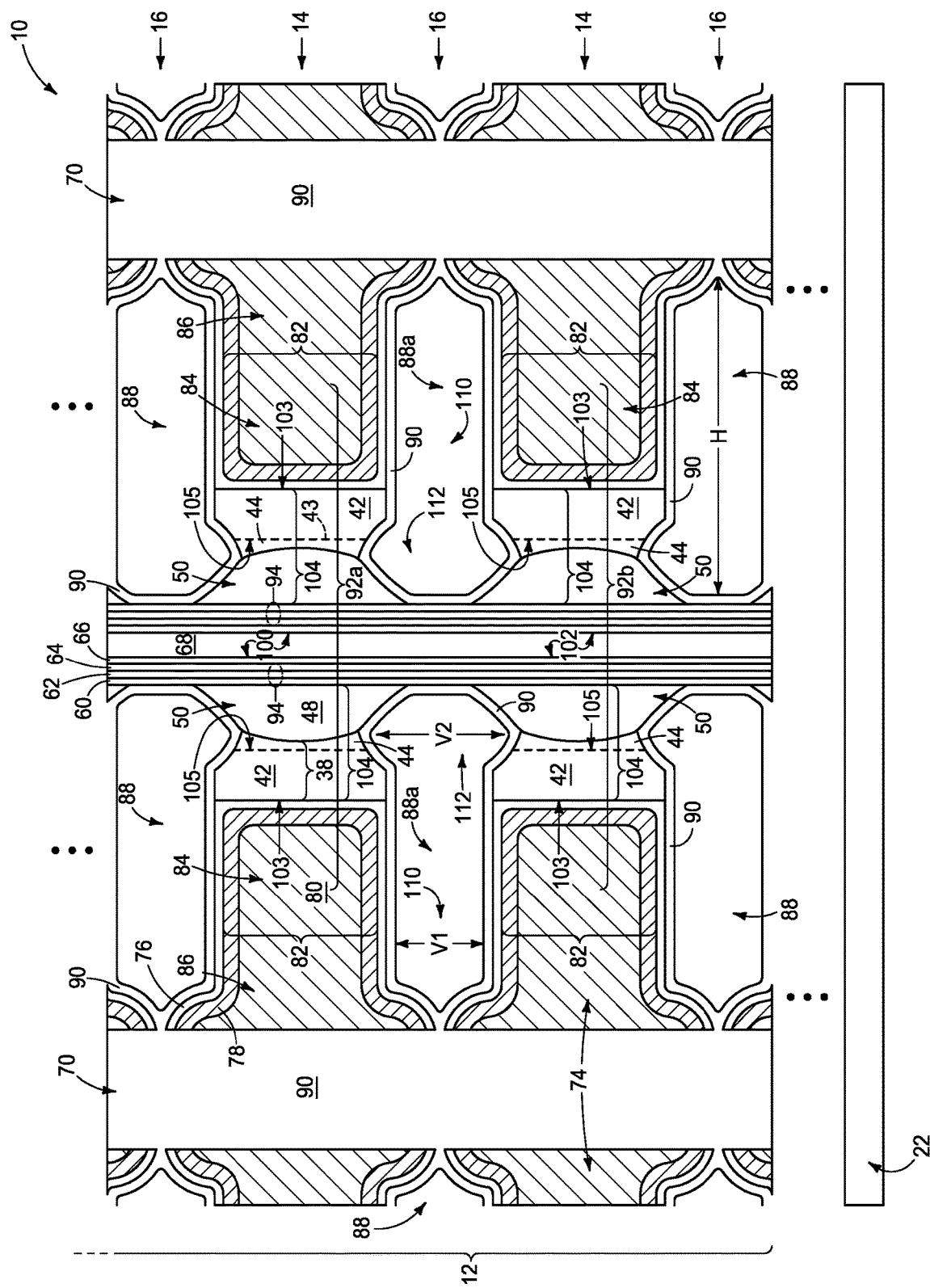

Referring to FIG. 23, additional insulative material 90 is provided within the openings 72 completely fill such openings.

The conductive gates 84, together with the dielectric barrier material 76, charge-blocking regions 38, charge-storage regions 50, tunneling materials 60, 62 and 64, and channel material 66 may be incorporated into memory cells 92a and 92b. Such memory cells may be NAND memory cells in some embodiments. The illustrated memory cells are vertically-stacked one atop another, and may be part of a NAND string. The memory cells 92a and 92b are substantially identical to one another (with the term "substantially identical" meaning identical to within reasonable tolerances of fabrication and measurement), and in some embodiments may be referred to as a first memory cell and a second memory cell, respectively. The memory cells 92a and 92b may be considered to be representative of a large number of substantially identical memory cells which may be fabricated across a memory array; such as, for example, a NAND memory array analogous to those described above with reference to FIGS. 1-4.

In operation, the charge-storage regions 50 may be configured to store information in the memory cells 92a and 92b. The value (with the term "value" representing one bit or multiple bits) of information stored in an individual memory cell (e.g., 92a) may be based on the amount of charge (e.g., the number of electrons) stored in a charge-storage region. The amount of charge within an individual charge-storage region 50 may be controlled (e.g., increased or decreased) at least in part, based on the value of voltage applied to an associated gate 84, and/or based on the value of voltage applied to an associated channel material 66.

The tunneling materials 60, 62 and 64 together form tunneling regions 94 of the memory cells 92a and 92b. Such tunneling regions may be configured to allow desired tunneling (e.g., transportation) of charge (e.g., electrons) between the charge-storage regions 50 and the channel material 66. The tunneling regions 94 may be configured (i.e., engineered) to achieve a selected criterion, such as, for example, but not limited to, an equivalent oxide thickness (EOT). The EOT quantifies the electrical properties of the tunneling region (e.g., the capacitance) in terms of a representative physical thickness. For example, EOT may be defined as the thickness of a theoretical silicon dioxide layer that would be required to have the same capacitance density as a given dielectric (e.g., tunneling region 94), ignoring leakage current and reliability considerations.

The charge-blocking region 38 is adjacent the charge-storage region 50, and may provide a mechanism to block charge from flowing from the charge-storage region 50 to the associated gate 84. The dielectric barrier material 76 is provided between the charge-blocking region 38 and the gate 84, and may be utilized to inhibit back-tunneling of charge-carriers from the associated gate 84 toward the charge-storage region 50. In some embodiments, the dielectric barrier material 76 may be considered to form dielectric barrier regions within the memory cells 92a and 92b.

In some embodiments, the channel material 66 may be considered to be a channel configured to conduct current. The channel includes a first channel portion 100 which is incorporated into the first memory cell 92a, and includes a second channel portion 102 which is incorporated into the second memory cell 92b.

The gate 84 which is incorporated into the memory cell 92a may be referred to as a first gate, and the gate 84 which is incorporated into the second memory cell 92b may be referred to as a second gate.

The charge-blocking region 38 and charge-storage region 50 within a memory cell may be together considered to be a memory cell structure 104. The memory cell structure 104 within the first memory cell 92a may be referred to as a first memory cell structure, and the memory cell structure 104 within the second memory cell 92b may be referred to as a second memory cell structure. The dielectric barrier material 76 forms dielectric barrier regions within the first and second memory cells 92a and 92b. Such dielectric barrier regions may be considered to be part of the memory cell structures 104 in some embodiments, and may be considered to be separate from the memory cell structures 104 in other embodiments. The dielectric barrier region within the first memory cell 92a may be referred to as a first dielectric barrier region, and the dielectric barrier region within the second memory cell 92b may be referred to as a second dielectric barrier region.

The charge-blocking regions 38 within the memory cell structures 104 are between the charge-storage regions 50 and the gates 84.

The gate 84 of the first memory cell 92a is vertically spaced from the gate 84 of the second memory cell 92b. A void 88 is vertically between the vertically-spaced gates 84 of the first and second memory cells 92a and 92b; and such void is labeled as 88a in FIG. 23 to enable the void to be distinguished from the other voids.

The void 88a has a first vertical dimension V1 between the first and second gates 84, and has a second vertical dimension V2 between the first and second charge-storage regions 50; with the second vertical dimension being greater than the first vertical dimension. In some embodiments, the first and second vertical dimensions may be within a range of from about 10 nm to about 100 nm; and the second vertical dimension may be greater than the first vertical dimension by at least about 5%, at least about 10%, at least about 20%, etc.

The silicon oxynitride 42 within the charge-blocking regions 38 may be considered to have two opposing lateral sides 103 and 105. The silicon dioxide 44 of the charge-blocking regions 38 is along only one of the opposing lateral sides (the side 105), and the other of the opposing lateral sides (the side 103) is directly adjacent the dielectric barrier material 76 in the shown embodiment.

In some embodiments, the stack 12 of FIG. 23 may be considered to comprise alternating insulative levels 16 and wordline levels 14. The channel material 66 extends vertically along the stack 12, and the gates 84 are along the wordline levels and spaced from the channel material by the tunneling materials (60, 62 and 64), the memory cell structures 104, and the dielectric barrier material 76.

The voids 88 are along the insulative levels 16, and are between the vertically-neighboring memory cells 92a and 92b. The voids 88 have horizontal dimensions (H), with such dimensions being sufficiently long that the individual voids have regions 110 that space vertically-neighboring gates 84 from one another, and have regions 112 that space vertically-neighboring charge-storage structures 50 from one another. Accordingly, the voids can provide electrical isolation between vertically-neighboring segments of charge-storage material, and can also provide electrical isolation between vertically-neighboring conductive gates.

In some embodiments, the regions 110 of the voids may be referred to as first regions, and the regions 112 of the voids may be referred to as second regions. In the illustrated embodiment, the second regions 112 of the voids 88 are vertically longer than the first regions 110 of the voids (and specifically the second regions 112 have the vertical thickness V2 while the first regions 110 have the vertical thickness V1).

The charge-storage regions (i.e., charge-storage structures) 50 are vertically-spaced from one another by intervening regions of the insulative levels 16. The vertical separation of the charge-storage regions 50 from one another may alleviate or prevent charge leakage between neighboring charge-storage regions within a common NAND string; and may mitigate coupling of charge-storage regions with other components (e.g., neighboring charge-storage regions, control gate, channel, tunnel oxide, etc.). Such may enable substantial improvements relative to conventional NAND configurations having a continuous charge-storage structure extending along all of the memory cells of a NAND string. Example improvements may include one or more of improved endurance, improvement in read/write budget, improvement in quick charge gain, improvement in quick charge loss, reduced cell-to-cell capacitive coupling, cycling, etc.

Isolation of vertically-adjacent charge-storage regions from one another (as compared to conventional configurations having continuous charge-storage regions) may alleviate or prevent charge leakage and charge coupling between neighboring charge-storage regions, and other neighboring components within a common NAND string. The vertically-adjacent charge-storage regions may be isolated from one another by intervening dielectric material(s) of various dielectric constant (k) values. Silicon dioxide may be a first natural choice if it is already formed at a tier deposition step. However, with tier thicknesses being scaled to ever-decreasing dimensions, the silicon dioxide k-value may be too high. This problem may be addressed by utilizing low-k dielectric (e.g., air) as at least some of the intervening dielectric material(s).

Provision of voids (e.g., air gaps) between vertically-adjacent wordlines may reduce capacitive capacitance between the wordlines, and may improve resistor-capacitor (RC) properties of the wordlines. Such may reduce programming delay and/or provide other advantages as compared to configurations having other isolation between the vertically-adjacent wordlines.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly having a channel to conduct current. The channel includes a first channel portion and a second channel portion. A first memory cell structure is located between a first gate and the first channel portion. The first memory cell structure includes a first charge-storage region and a first charge-blocking region. The first charge-blocking region is located between the first charge-storage region and the first gate. The first charge-blocking region includes silicon oxynitride. A second memory cell structure is located between a second gate and the second channel portion. The second memory cell structure includes a second charge-storage region and a second charge-blocking region. The second charge-blocking region is located between the second charge-storage region and the second gate. The second charge-blocking region includes silicon oxynitride. A void is located between the first and second gates, and between the first and second memory cell structures.

Some embodiments include a memory array having a vertical stack of alternating insulative levels and wordline levels. Channel material extends vertically along the stack. Gates are along the wordline levels. Memory cell structures are along the wordline levels and are located between the gates and the channel material. The memory cell structures include charge-storage regions and charge-blocking regions. The charge-blocking regions are between the charge-storage regions and the gates. Voids are along the insulative levels. Individual voids each comprise a first region between a pair of vertically-neighboring gates and a second region between a pair of vertically-neighboring charge-storage regions. Insulative liners are within the voids and along outer peripheries of the voids.

Some embodiments include a method of forming an assembly. A first opening is formed through a stack of alternating first and second levels. The first levels comprise first material, and the second levels comprise second material. The second material of the second levels is recessed along the first opening to form first gaps. The first gaps are vertically between segments of the first levels. First protective structures are formed within the first gaps. The first material of the first levels is recessed along the first opening to form second gaps. The second gaps are vertically between segments of the first protective structures. Oxidizing conditions are utilized to oxidize edges of the first material of the first levels along the second gaps and to oxidize edges of the first protective structures along the first opening. The oxidized edges of the first material are charge-blocking regions, and are along remaining portions of the first levels. The oxidized edges of the first protective structures are ledges. Third gaps are vertically between the ledges. Charge-trapping regions are formed within the third gaps and along the charge-blocking regions. The ledges are removed to leave fourth gaps. The fourth gaps are vertically between the charge-trapping regions. Second protective structures are formed within the fourth gaps and directly adjacent the first protective structures. Vertically-extending tunneling material is formed within the first opening. The tunneling material extends along edges of the second protective structures and along the charge-trapping regions. Channel material is formed within the first opening and adjacent the tunneling material. A second opening is formed through the stack, with the second opening extending through the remaining portions of the first levels. The remaining portions of the first material of the first levels are removed to form cavities along the second opening. Conductive regions are formed within the cavities. The second material, the first protective structures, and the second protective structures are removed to form voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. An assembly, comprising:
  a channel to conduct current; the channel including a first channel portion and a second channel portion; the channel comprising semiconductor material;
  a first memory cell structure located between a first gate and the first channel portion; the first memory cell structure including a first charge-storage region and a first charge-blocking region; the first charge-blocking region being located between the first charge-storage region and the first gate; the first charge-blocking region comprising silicon, oxygen and nitrogen;
  a second memory cell structure located between a second gate and the second channel portion; the second memory cell structure including a second charge-storage region and a second charge-blocking region; the second charge-blocking region being located between the second charge-storage region and the second gate; the second charge-blocking region comprising silicon, oxygen and nitrogen; and
  a void located between the first and second gates, and between the first and second memory cell structures.

2. The assembly of claim 1 comprising an insulative liner along an outer periphery of the void.

3. The assembly of claim 2 wherein the void has a first vertical dimension between the first and second gates and a second vertical dimension between the first and second charge-storage regions; and wherein the second vertical dimension is greater than the first vertical dimension.

4. A memory array, comprising:
  a vertical stack of alternating insulative levels and conductive levels;
  channel material extending through the stack; the channel material comprising silicon;
  gates along the conductive levels;
  memory cell structures along the conductive levels and located between the gates and the channel material; the memory cell structures including charge-storage regions and charge-blocking regions;
  voids along the insulative levels; individual of the voids each comprising a first region between a pair of vertically-neighboring of the gates and a second region between a pair of vertically-neighboring of the charge-storage regions; and insulative liners within the voids and along outer peripheries of the voids.

5. The memory array of claim 4 wherein the conductive levels also comprise wordline regions horizontally adjacent the gates; and wherein the voids have additional regions between vertically-neighboring wordline regions.

6. The memory array of claim 4 wherein the second regions of the voids are vertically longer than the first regions of the voids.

7. The memory array of claim 4 wherein the insulative liners comprise silicon dioxide.

8. The memory array of claim 4 wherein the charge-blocking regions comprise silicon, oxygen and nitrogen.

9. A method of forming an assembly, comprising:

forming a first opening through a stack of alternating first and second levels; the first levels comprising first material, and the second levels comprising second material;

recessing the second material of the second levels along the first opening to form first gaps; the first gaps being vertically between segments of the first levels;

forming first protective structures within the first gaps;

recessing the first material of the first levels along the first opening to form second gaps; the second gaps being vertically between segments of the first protective structures;

utilizing oxidizing conditions to oxidize edges of the first material of the first levels along the second gaps and to oxidize edges of the first protective structures along the first opening; the oxidized edges of the first material being charge-blocking regions, and being along remaining portions of the first material of the first levels; the oxidized edges of the first protective structures being ledges; third gaps being vertically between the ledges;

forming charge-storage regions within the third gaps and along the charge-blocking regions;

removing the ledges to leave fourth gaps, the fourth gaps being vertically between the charge-storage regions;

forming second protective structures within the fourth gaps and directly adjacent the first protective structures;

forming tunneling material within the first opening, the tunneling material extending along edges of the second protective structures and along the charge-storage regions;

forming channel material within the first opening and adjacent the tunneling material; the channel material comprising silicon;

forming a second opening through the stack, with the second opening extending through the remaining portions of the first material of the first levels;

removing the remaining portions of the first material of the first levels to form cavities along the second opening;

forming conductive regions within the cavities; and removing the second material of the second levels, the first protective structures, and the second protective structures to form voids.

10. The method of claim 9 wherein the first material comprises silicon nitride; wherein the first protective structures comprise polycrystalline silicon; and wherein the oxidizing conditions oxidize induce more expansion along the polycrystalline silicon than along the silicon nitride.

11. The method of claim 9 wherein the first material comprises silicon nitride; wherein the first protective structures comprise polycrystalline silicon; and wherein the oxidizing conditions oxidize the polycrystalline silicon faster than the silicon nitride.

12. The method of claim 9 wherein the first material comprises silicon nitride, and wherein the second material comprises silicon dioxide.

13. The method of claim 9 wherein the first material comprises silicon nitride, and wherein the charge-blocking regions comprise silicon oxynitride.

14. The method of claim 9 wherein the first and second protective structures are a same composition as one another.

15. The method of claim 9 wherein the first and second protective structures comprise polycrystalline silicon.

16. The method of claim 9 further comprising lining the voids with insulative material.

17. The method of claim 10 wherein the oxidizing conditions induce at least about double the expansion along the polycrystalline silicon than along the silicon nitride.

18. The method of claim 10 wherein the oxidizing conditions induce substantially no expansion along the silicon nitride.

19. The method of claim 13 wherein the charge-blocking regions also comprise silicon dioxide.

20. The method of claim 19 wherein the silicon oxynitride of the charge-blocking regions has a first horizontal thickness; wherein the silicon dioxide of the charge-blocking regions has a second horizontal thickness; and wherein the first horizontal thickness as at least about double the first horizontal thickness.

21. The method of claim 16 wherein the insulative material comprises silicon dioxide.

22. The method of claim 16 wherein the voids have orifices extending to the second opening; and wherein the insulative material seals the orifices.

* * * * *